US012641951B2

(12) United States Patent
Sakakibara et al.

(10) Patent No.: US 12,641,951 B2
(45) Date of Patent: May 26, 2026

(54) LIGHT-EMITTING ELEMENT AND DISPLAY DEVICE

(71) Applicant: SHARP KABUSHIKI KAISHA, Sakai City (JP)

(72) Inventors: Yusuke Sakakibara, Sakai City (JP); Masaki Yamamoto, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 560 days.

(21) Appl. No.: 18/020,651

(22) PCT Filed: Aug. 28, 2020

(86) PCT No.: PCT/JP2020/032492
§ 371 (c)(1),
(2) Date: Feb. 10, 2023

(87) PCT Pub. No.: WO2022/044240
PCT Pub. Date: Mar. 3, 2022

(65) Prior Publication Data
US 2023/0337456 A1      Oct. 19, 2023

(51) Int. Cl.
H10K 50/818 (2023.01)
H04N 13/30 (2018.01)
(Continued)

(52) U.S. Cl.
CPC ........... H10K 50/818 (2023.02); H04N 13/30 (2018.05); H10K 50/115 (2023.02);
(Continued)

(58) Field of Classification Search
CPC ............... H10K 50/818; H10K 50/115; H10K 59/80518; H10K 59/879; H10K 59/00;
(Continued)

(56) References Cited

U.S. PATENT DOCUMENTS

| | | | |
|---|---|---|---|
| 2016/0064683 A1* | 3/2016 | Toyoda | H10K 50/13 257/40 |
| 2020/0243616 A1* | 7/2020 | Boardman | H10K 50/11 |

(Continued)

FOREIGN PATENT DOCUMENTS

| | | |
|---|---|---|
| JP | 2008203609 A | 9/2008 |
| JP | 2018005113 A | 1/2018 |
| WO | 2019078235 A1 | 4/2019 |

OTHER PUBLICATIONS

Han et. al., "Solution-processed fabrication of highly transparent mono- and tricolored quantum dot-light-emitting diodes," Organic Electronics, Mar. 2017 (Year: 2017).*

(Continued)

*Primary Examiner* — Khaja Ahmad
*Assistant Examiner* — Alvin L Lee
(74) *Attorney, Agent, or Firm* — ScienBiziP, P.C.

(57) ABSTRACT

A light-emitting element includes: a first electrode having a reflective surface that reflects light; a second electrode that transmits light; and a light-emitting layer between the first electrode and the second electrode, the light-emitting layer containing a first light-emitting material that emits first light that has a peak wavelength equal to a first wavelength and a second light-emitting material that emits second light that has a peak wavelength equal to a second wavelength shorter than the first wavelength, wherein the second light has at least one location where intensity is higher in a direction off a normal to the reflective surface than in the normal.

10 Claims, 13 Drawing Sheets

(51) Int. Cl.
H10K 50/115 (2023.01)
H10K 59/00 (2023.01)
H10K 59/80 (2023.01)

(52) U.S. Cl.
CPC ..... H10K 59/80518 (2023.02); H10K 59/879 (2023.02); *H04N 2013/40* (2018.05); *H10K 59/00* (2023.02)

(58) Field of Classification Search
CPC .... H10K 59/35; H04N 13/30; H04N 2013/40; H05B 33/12; H05B 33/14; H05B 33/24; H05B 33/26; H05B 33/28
See application file for complete search history.

(56) References Cited

U.S. PATENT DOCUMENTS

| | | |
|---|---|---|
| 2020/0328325 A1 | 10/2020 | Miyanaga et al. |
| 2023/0255039 A1* | 8/2023 | Doe ..................... H10K 50/814 257/40 |

OTHER PUBLICATIONS

Matloub et. al.,"Switchable Multi-Color Solution-Processed QD-laser," Scientific Reports, Mar. 2013 (Year: 2013).*
Gou et. al.,"Angular color shift of micro-LED displays," Optics Express, Jun. 2019 (Year: 2019).*

* cited by examiner

5

B2:(100, 100, 100)

B1:(0, 0, 0)

5

B2:(100, 100, 170)

B1:(0, 0, 0)

FIG. 14
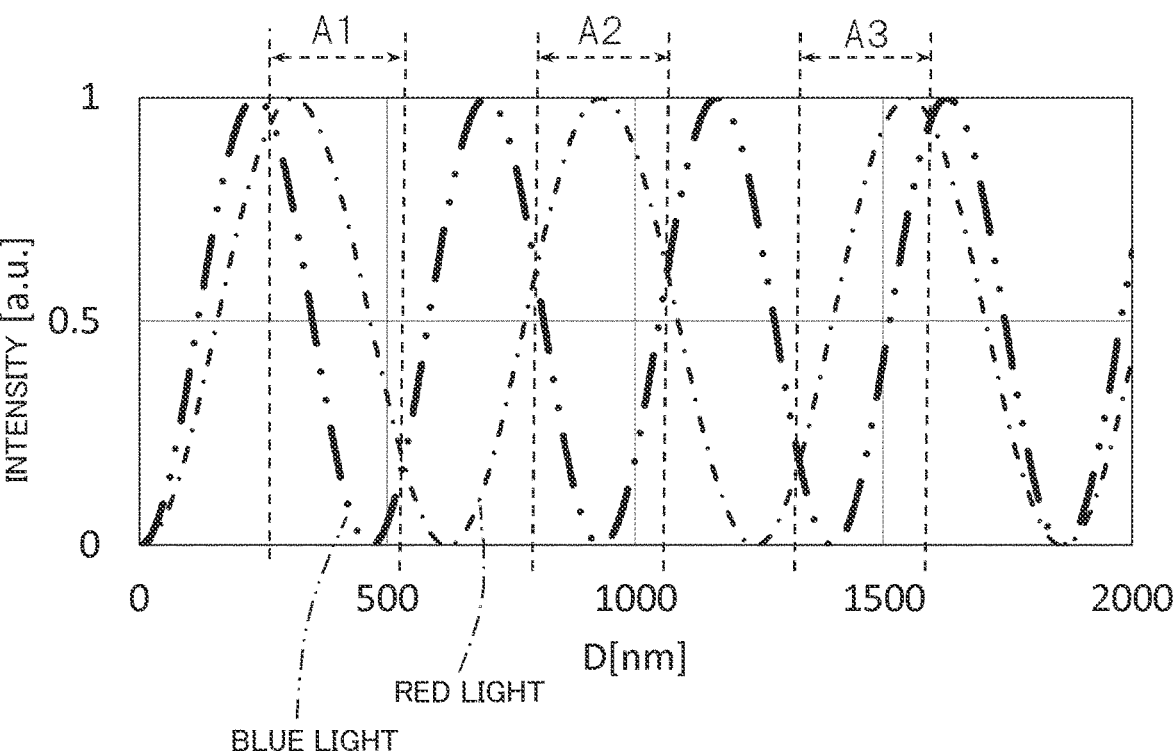
RED LIGHT
BLUE LIGHT
FIG. 15    13r
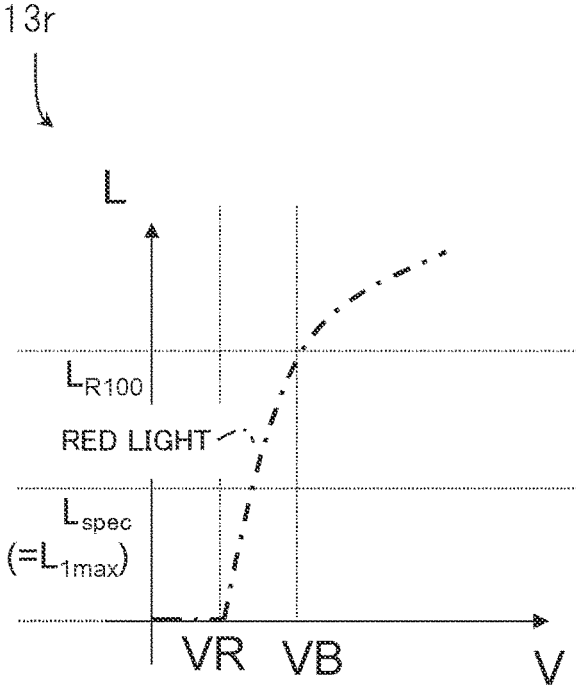

| MATERIAL FOR BLUE QDs | WAVELENGTH $\lambda_{blue}$[nm] | D[nm] | THICKNESS [nm] |
|---|---|---|---|
| ZnSe | 430 | 645~1075 | 161~269 |
| ZnSe (LARGE PARTICLE DIAMETER) | 450 | 675~1125 | 169~281 |
| BT2020(CdSe) | 467 | 701~1168 | 175~292 |

| MATERIAL FOR BLUE QDs | WAVELENGTH $\lambda_{blue}$[nm] | DL[nm] | THICKNESS [nm] |
|---|---|---|---|
| ZnSe | 430 | 215~645 | 54~161 |
| ZnSe (LARGE PARTICLE DIAMETER) | 450 | 225~675 | 56~169 |
| BT2020(CdSe) | 467 | 234~701 | 58~175 |

LIGHT-EMITTING ELEMENT AND DISPLAY DEVICE

TECHNICAL FIELD

The present disclosure relates to light-emitting elements and display devices.

BACKGROUND ART

Patent Literature 1 discloses a display device, such as a liquid crystal display device or an OLED display device, including a display element with a display surface in which a viewing angle control unit including a liquid crystal layer is disposed. In this display device, the viewing angle of the display element is controlled by controlling the alignment of the liquid crystal layer in the viewing angle control unit.

CITATION LIST

Patent Literature

Patent Literature 1
Japanese Unexamined Patent Application Publication, Tolwkai, No. 2008-203609

SUMMARY OF INVENTION

Technical Problem

The display device of Patent Literature 1 has a reduced light intensity because the light exiting through the display surface of the display element needs to be passed through the liquid crystal layer in the viewing angle control unit. The present disclosure, in an aspect thereof, provides a light-emitting element and a display device both capable of restraining decreases in light intensity and restricting peeping from oblique directions.

Solution to Problem

The present disclosure, in one aspect thereof, is directed to a light-emitting element including: a first electrode having a reflective surface that reflects light; a second electrode that transmits light; and a light-emitting layer between the first electrode and the second electrode, the light-emitting layer containing a first light-emitting material that emits first light that has a peak wavelength equal to a first wavelength and a second light-emitting material that emits second light that has a peak wavelength equal to a second wavelength shorter than the first wavelength, wherein the second light has at least one location where intensity is higher in a direction off a normal to the reflective surface than in the normal.

The present disclosure, in one aspect thereof, is directed to a light-emitting element including: a first electrode having a reflective surface that reflects light; a second electrode that transmits light; and a light-emitting layer between the first electrode and the second electrode, the light-emitting layer containing a first light-emitting material that emits first light that has a peak wavelength equal to a first wavelength and a second light-emitting material that emits second light that has a peak wavelength equal to a second wavelength shorter than the first wavelength, wherein letting $\lambda_2$ represent the second wavelength, $\theta$ represent an angle of inclination from a normal to the reflective surface, D represent an optical path length difference in the normal to the reflective surface between reflection light that is the second light reflected by the reflective surface and transmitted by the second electrode and direct light that is the second light not reflected by the reflective surface, but transmitted by the second electrode, $\sin^2(\pi D/\lambda_2)$ represent intensity of light produced by interference of the reflection light and the direct light in the second light, and $\sin^2(\pi D\cos\theta/\lambda_2)$ represent intensity of light produced by interference of the reflection light and the direct light in the second light in the angle of inclination $\theta$, the light-emitting element has $\lambda_2$, D, and $\theta$ that satisfy $\sin^2(\pi D\cos\theta/\lambda_2) > \sin^2(\pi D/\lambda_2)$ in a direction off the normal to the reflective surface.

BRIEF DESCRIPTION OF DRAWINGS

FIG. 7 is a diagram showing an image displayed in the display area of the display device in accordance with the comparative example, as viewed from a direction inclined to the normal to the display area by a user.

FIG. 14 is a diagram representing the intensity of red and blue light in the normal direction N for various optical path length differences in a light-emitting element in accordance with an embodiment.

FIG. 15 is a schematic diagram representing a relationship between the voltage applied across a light-emitting layer exclusively of red-light-emitting quantum dots and the luminance of the quantum dots in the light-emitting layer.

DESCRIPTION OF EMBODIMENTS

Embodiments

Figure 1:
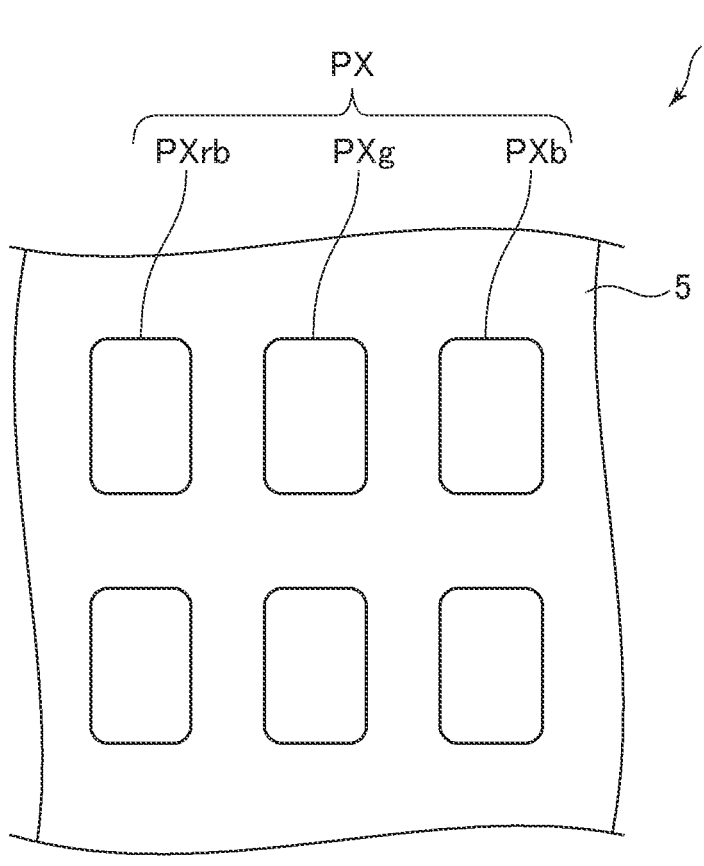
FIG. 1 is an enlarged plan view of a part of a display area of a display device in accordance with an embodiment.

FIG. 1 is an enlarged plan view of a part of a display area 5 of a display device 1 in accordance with an embodiment. The display device 1 includes, for example: the display area. (display unit) 5 for displaying an image; and a frame area (not shown) surrounding the display area 5 like a frame. The display area 5 includes a matrix of pixels PX.

Each pixel PX includes a red pixel PXrb that is a subpixel for emitting red light (first light), a green pixel PXg that is a subpixel for emitting green light (third light), and a blue pixel PXb that is a subpixel for emitting blue light (second light). For instance, one pixel PX includes three subpixels: a red pixel PXrb, a green pixel PXg, and a blue pixel PXb.

Red light has a wavelength (first wavelength) with a peak wavelength of, for example, from 600 nm exclusive to 780 nm inclusive. Green light has a wavelength (third wavelength) with a peak wavelength shorter than that of red light and longer than that of blue light at, for example, from 500 nm exclusive to 600 nm inclusive. Blue light has a peak wavelength (second wavelength) with a peak wavelength shorter than those of red and green light at, for example, from 400 nm to 500 nm, both inclusive.

Note that in the present embodiment, for example, between the red pixel PXrb, the green pixel PXg, and the blue pixel PXb, the red pixel PXrb appears to be emitting purely red light, mixed red and blue light, or blue light instead of red light, depending on drive voltage and the angle at which the user views the display area 5. This particular structure renders the image displayed in the display area 5 of the display device 1 in accordance with the present embodiment easy to recognize when viewed normal to the display area 5 (from the front direction), but difficult to recognize when viewed obliquely to the display area 5 (from directions inclined to the normal). The display device 1 can hence restrict peeping from oblique directions.

The display device 1 switches image-display mode between a first display mode ((normal mode) and a second display mode in which peeping from oblique directions is restricted, in response to an instruction signal given by the user. The display device 1 may, for example, switch between the first display mode and the second display mode, for example, through the operation of installed hardware such as a switching mechanism or through a combination of software pre-installed in a memory unit for the switching between the first display mode and the second display mode and the operation of, for example, a CPU retrieving and executing the software. The first display mode and the second display mode will be described later in detail.

Figure 2:
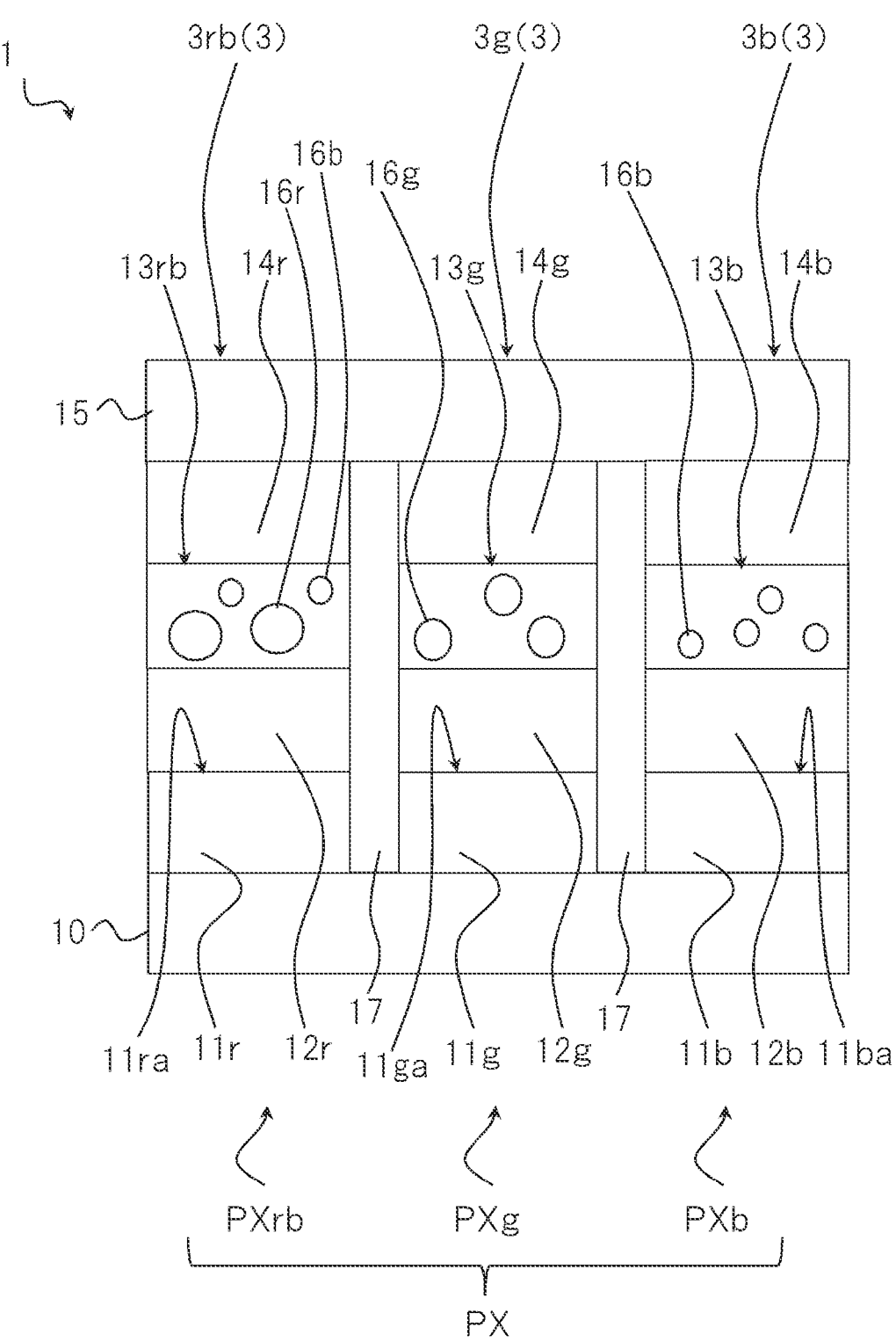
FIG. 2 is a schematic cross-sectional view of a red pixel, a green pixel, and a blue pixel in a display device in accordance with an embodiment.

FIG. 2 is a schematic cross-sectional view of the red pixel PXrb, the green pixel PXg, and the blue pixel PXb in the display device 1 in accordance with an embodiment. The display device 1 includes, for example, an array substrate 10, banks 17, a light-emitting element (first light-emitting element) 3rb, a light-emitting element (third light-emitting element) 3g, and a light-emitting element (second light-emitting element) 3b.

The banks 17 are stacked on the array substrate 10, serving as partitions separating the red pixel PXrb, the green pixel PXg, and the blue pixel PXb. The banks 17 may contain, for example, an electrically insulating material such as a polyimide or an acrylic.

The light-emitting element 3rb primarily emits red light and is disposed in the red pixel PXrb on the array substrate 10. The light-emitting element 3rb primarily emits red light normal to the display area 5 (FIG. 1) (upward from below in FIG. 2) and emits either red light mixed with blue light or blue light in directions inclined to the normal to the display area 5, depending on the angle of inclination.

The light-emitting element 3g emits green light and is disposed in the green pixel PXg on the array substrate 10. The light-emitting element 3g emits green light both normal to the display area 5 and in directions inclined to the normal. The light-emitting element 3b emits blue light and is disposed in the blue pixel PXb on the array substrate 10. The light-emitting element 3b emits blue light both normal to the display area 5 and in directions inclined to the normal.

For instance, the light-emitting element 3rb, the light-emitting element 3g, and the light-emitting element 3b are sequentially adjacent to one another. The light-emitting element 3rb, the light-emitting element 3g, and the light-emitting element 3b may be arranged in any order. In addition, the light-emitting element 3rb, the light-emitting element 3g, and the light-emitting element 3b may be simply referred to as the light-emitting elements 3 when there is no need to distinguish between the light-emitting element 3rb, the light-emitting element 3g, and the light-emitting element 3b.

The array substrate 10 carries mounted thereon a plurality of TFTs (thin film transistors) for controlling the emission and non-emission of light by the light-emitting elements 3$rb$, 3$g$, 3$b$. The array substrate 10 includes, for example, a flexible base member, an inorganic insulating layer stacked on the base member, the plurality of TFTs provided in the inorganic insulating layer, and an interlayer insulating layer (planarization film) stacked on the inorganic insulating layer to cover the plurality of TFTs. The flexible base member may contain, for example, an organic insulating material such as a polyimide. The inorganic insulating layer has a monolayer or multilayer structure and may contain, for example, silicon oxide, silicon nitride, or silicon oxynitride. The interlayer insulating layer may contain, for example, a polyimide or an acrylic-based organic insulating material. This structure enables fabrication of the flexible array substrate 10. Note that the array substrate 10 may include a rigid base member containing an inorganic insulating material such as glass, in place of the flexible base member.

For instance, the light-emitting element 3$rb$ includes a first electrode 11$r$, an electron transport layer 12$r$, a light-emitting layer 13$rb$, and a hole transport layer 14$r$, all of which are provided in the stated order when viewed from the array substrate 10. In addition, for example, the light-emitting element 3$g$ includes a first electrode 11$g$, an electron transport layer 12$g$, a light-emitting layer 13$g$, and a hole transport layer 14$g$, all of which are provided in the stated order when viewed from the array substrate 10. In addition, for example, the light-emitting element 3$b$ includes a first electrode 11$b$, an electron transport layer 12$b$, a light-emitting layer 13$b$, and a hole transport layer 14$b$, all of which are provided in the stated order when viewed from the array substrate 10. The light-emitting elements 3$rb$, 3$g$, 3$b$ further include second electrodes 15 stacked respectively on the hole transport layers 14$r$, 14$g$, 14$b$.

In the present embodiment, for example, the light-emitting elements 3$rb$, 3$g$, 3$b$ are described assuming that the light-emitting elements 3$rb$, 3$g$, 3$b$ have a forward structure. In other words, as an example, the first electrodes 11$r$, 11$g$, 11$b$ are cathodes and reflective electrodes, and the second electrode 15 is an anode and a transparent electrode.

Here, of the transparent electrode and the reflective electrodes, the transparent electrode is provided on a side where the light emitted by the light-emitting layer 13$rb$, the light-emitting layer 13$g$, and the light-emitting layer 13$b$ is extracted out of the light-emitting element 3$rb$, the light-emitting element 3$g$, and the light-emitting element 3$b$.

In addition, of the transparent electrode and the reflective electrodes, the reflective electrodes are provided opposite the electrodes provided on the side Where the light emitted by the light-emitting layer 13$rb$, the light-emitting layer 13$g$, and the light-emitting layer 13$b$ is extracted out of the light-emitting element 3$rb$, the light-emitting element 3$g$, and the light-emitting element 3$b$. In other words, the reflective electrodes reflect light emitted by the light-emitting layer 13$rb$, the light-emitting layer 13$g$, and the light-emitting layer 13$b$.

Note that the light-emitting elements 3$rb$, 3$g$, 3$b$ may have a reverse structure. In other words, the first electrodes 11$r$, 11$g$, 11$b$ may be anodes and reflective electrodes, and the second electrode 15 be a cathode and a transparent electrode. In such a reverse structure, for example, the light-emitting element 3$rb$ includes the hole transport layer 14$r$, the light-emitting layer 13$rb$, the electron transport layer 12$r$, and the second electrode 15 (cathode and transparent electrode), all of Which are provided in the stated order on the first electrode 11$r$ (anode and reflective electrode). In addition, in the reverse structure, for example, the light-emitting element 3$g$ includes the hole transport layer 14$g$, the light-emitting layer 13$g$, the electron transport layer 12$g$, and the first electrode 15 (cathode and transparent electrode), all of which are provided in the stated order on the first electrode 11$g$ (anode and reflective electrode). Additionally, in the reverse structure, for example, the light-emitting element 3$b$ includes the hole transport layer 14$b$, the light-emitting layer 13$b$, the electron transport layer 12$b$, and the first electrode 15 (cathode and transparent electrode), all of which are provided in the stated order on the first electrode 11$b$ (anode and reflective electrode).

In the present embodiment, for example, the light-emitting elements 3$rb$, 3$g$, 3$b$ emit light by "electroluminescence (EL)" where quantum dots in the light-emitting layers 13$rb$, 13$g$, 13$b$ emit light due to the electric current between the first electrodes 11$r$, 11$g$, 11$b$ and the second electrode 15.

As an example, the first electrode 11$r$, the electron transport layer 12$r$, the light-emitting layer 13$rb$, and the hole transport layer 14$r$ are provided in an insular manner separately for each light-emitting element 3$rb$ (in other words, for each the red pixel PX$rb$). The first electrode 11$g$, the electron transport layer 12$g$, the light-emitting layer 13$g$, and the hole transport layer 14$g$ are provided in an insular manner separately for each light-emitting element 3$g$ (in other words, for each the green pixel PX$g$). The first electrode 11$b$, the electron transport layer 12$b$, the light-emitting layer 13$b$, and the hole transport layer 14$b$ are provided in an insular manner separately for each light-emitting element 3$b$ (in other words, for each blue pixel PX$b$). The second electrode is provided, for example, as a continuous layer across the light-emitting elements 3$rb$, 3$g$, 3$b$, not separately for each light-emitting element 3$rb$, 3$g$, 3$b$.

The first electrode 11$r$ injects electrons to the electron transport layer 12$r$. The first electrode 11$g$ injects electrons to the electron transport layer 12$g$. The first electrode 11$b$ injects electrons to the electron transport layer 12$b$. The first electrode 11$r$ is provided opposite the light-emitting layer 13$rb$ across the electron transport layer 12$r$. The first electrode 11$g$ is provided opposite the light-emitting layer 13$g$ across the electron transport layer 12$g$. The first electrode lib is provided opposite the light-emitting layer 13$b$ across the electron transport layer 12$b$.

The first electrode 11$r$, the first electrode 11$g$, and the first electrode lib are stacked on the interlayer insulating layer in the array substrate 10, separated from each other by the banks 17. In other words, the first electrode 11$r$, the first electrode 11$g$, and the first electrode 11$b$ are arranged next to each other across the banks 17 in a plan view.

The first electrode 11$r$ is connected to a T$yr$ disposed in a layer underlying the interlayer insulating layer through a contact hole in the interlayer insulating layer. The first electrode 11$g$ is connected to a TFT disposed in a layer underlying the interlayer insulating layer through a contact hole in the interlayer insulating layer. The first electrode 11$b$ is connected to a TFT disposed in a layer underlying the interlayer insulating layer through a contact hole in the interlayer insulating layer. These connections of the insularly separated, first electrodes 11$r$, 11$g$, 11$b$ to the respective TFTs enable the display device 1 to control the emission and non-emission of light by each light-emitting element 3$rb$, 3$g$, 3$b$. The display device 1 can hence function as a display device capable of displaying various images.

The contact surface of the first electrode 11$r$ where the first electrode 11$r$ is in contact with the electron transport layer 12$r$ is a reflective surface 11$ra$ that reflects the light emitted by the light-emitting layer 13$rb$ stacked on the first electrode 11$r$ across the electron transport layer 12$r$. The contact surface of the first electrode 11g where the first electrode 11g is in contact with the electron transport layer 12g is a reflective surface 11ga that reflects the light emitted by the light-emitting layer 13g stacked on the first electrode 11g across the electron transport layer 12g. The contact surface of the first electrode 11b where the first electrode 11b is in contact with the electron transport layer 12b is a reflective surface 11ba that reflects the light emitted by the light-emitting layer 13b stacked on the first electrode 11b across the electron transport layer 12b.

The first electrodes 11r, 11g, 11b are reflective electrodes and may be made using, for example, a reflective metal layer that has a high reflectance to visible light. The reflective metal layer with a high reflectance to visible light may contain, for example, a metal such as Al, Cu, Au, or Ag. Note that the reflective metal layer is preferably made using, for example, a material that has a reflectance of 80% or higher to visible light. In addition, the first electrodes 11r, 11g, 11b may be made using a transparent conductive layer that has a high transmittance to visible light as well as the reflective metal layer. The transparent conductive layer may contain, for example, a transparent conductive material such as ITO (indium tin oxide), IZO (indium zinc oxide), ZnO (zinc oxide), AZO (aluminum-doped zinc oxide), or GZO (gallium-doped zinc oxide). Note that the transparent conductive layer is preferably made using, for example, a material that has a transmittance of 80% or higher to visible light.

The layers constituting the first electrodes 11r, 11g, 11b may be formed by, for example, sputtering or vapor deposition. Note that the first electrodes 11r, 11g, 11b do not necessarily have a two-layered structure and may have a monolayer structure or a multilayer structure in which three or more layers are stacked.

The banks 17 are stacked, for example, on the interlayer insulating layer in the array substrate 10, to cover the contact holes in the interlayer insulating layer in the array substrate 10. The banks 17 may be formed by, for example, applying an organic material, such as a polyimide or an acrylic, to the array substrate 10 and subsequently patterning the applied organic material by, for example, photolithography.

The banks 17 cover, for example, the edges of the first electrodes 11r, 11g, 11b. This particular structure enables the banks 17 to serve as an edge cover for the first electrodes 11r, 11g, 11b. In other words, the banks 17 enables restraining excessive electric fields from developing along and near the edges of the first electrodes 11r, 11g, 11b.

The electron transport layer 12r transports the electrons injected from the first electrode 11r to the light-emitting layer 13rb. The electron transport layer 12g transports the electrons injected from the first electrode 11g to the light-emitting layer 13g. The electron transport layer 12b transports the electrons injected from the first electrode 11b to the light-emitting layer 13b.

The electron transport layer 12r is stacked on the light-emitting layer 13rb. In other words, the electron transport layer 12r is disposed between the first electrode 11r and the light-emitting layer Deb. The electron transport layer 12g is stacked on the light-emitting layer 13g. In other words, the electron transport layer 12g is disposed between the first electrode 11g and the light-emitting layer 13g. The electron transport layer 12b is stacked on the light-emitting layer 13b. In other words, the electron transport layer 12b is disposed between the first electrode 11b and the light-emitting layer 13b. The electron transport layers 12r, 12g, 12b contain a plurality of electron-transportable nanoparticles. The electron transport layers 12r, 12g, 12b may be formed by, for example, inkjet printing-based coating with different materials, vapor deposition using a mask, or photolithography.

Note that the electron transport layers 12r, 12g, 12b may have a function of restraining holes from being transported from the light-emitting layers 13rb, 13g, 13b to the first electrodes 11r, 11g, 11b (hole blocking function).

The light-emitting layer 13rb contains a plurality of red-light-emitting quantum dots (first light-emitting material) 16r and a plurality of blue-tight-emitting quantum dots (second light-emitting material) 16b. The light-enduing layer 13g contains a plurality of green-light-emitting quantum dots (third light-emitting material) 16g. The light-emitting layer 13b contains a plurality of blue-light-emitting quantum dots 16b.

The light-emitting layer 13rb may contain a first light-emitting material and a second light-emitting material that emit light of different colors, and either one or both of the first light-emitting material and the second light-emitting material be quantum dots.

As an example, the light-emitting layer 13rb may contain a plurality of quantum dots (first light-emitting material) 16r and a blue-light-emitting, organic EL layer (second light-emitting material). As an alternative example, the light-emitting layer 13rb may contain a red-light-emitting, organic EL layer (first light-emitting material) and a plurality of quantum dots (second light-emitting material) 16b.

Note that, for example, the light-emitting layer 13rb may contain a violet light-emitting material in place of the blue-light-emitting material, to emit violet light.

The light-emitting layer 13g may contain a green-light-emitting, organic EL layer (third tight-emitting material) in place of the plurality of quantum dots (third light-emitting material) 16g. The light-emitting layer 13b may contain a blue-light-emitting, organic EL layer (second light-emitting material) in place of the plurality of quantum dots (second light-emitting material) 16b.

For instance, the light-emitting layer 13rb is disposed between the electron transport layer 12r and the hole transport layer 14r. For instance, the light-emitting layer 13g is disposed between the electron transport layer 12g and the hole transport layer 14g. For instance, the light-emitting layer 13b is disposed between the electron transport layer 12b and the hole transport layer 14b.

The light-emitting layer 13rb, the light-emitting layer 13g, and the light-emitting layer 13b are separated from each other by the banks 17. In other words, the light-emitting layer 13rb, the light-emitting layer 13g, and the light-emitting layer 13b are arranged next to each other across the banks 17 in a plan view.

The light-emitting layers 13rb, 13g, 13b may be formed by, for example, inkjet printing-based coating with different materials, vapor deposition using a mask, or photolithography.

The quantum dots 16r, 16g, 16b are all semiconductor nanoparticles. The quantum dots 16r, 16g, 16b in the respective light-emitting layers 13rb, 13g, 13b may be made of a light-emitting material that have a valence band energy level (equal to the ionization potential) and a conduction band energy level (equal to the electron affinity) such that the light-emitting material can emit light through recombination of the holes on the valence band energy level and the electrons on the conduction band energy level. Since the quantum dots 16r, 16g, 16b, having uniform particle diameters, emit light that has a narrow spectrum due to the quantum confinement effect, the emitted, resultant light has relatively deep chromaticity.

The quantum dots 16r, 16g, 16b may contain, for example, one or more semiconductor materials selected from the group consisting of CdS, CdSe, CdTe, ZnS, ZnSe, ZnTe, InN, kW, InAs, InSb, AlP, AlS, AlAs, AlSb, GaN, GaP, GaAs, GaSb, PbS, Pb Se, Si, Ge, MgS, MgSe, MgTe, and combinations of any of these compounds. In addition, the quantum dots 16r, 16g, 16b may have a two-component core structure, a three-component core structure, a four-component core structure, a core-shell structure, a core-multishell structure, a doped nanoparticle structure, or a composition-gradient structure. In addition, for example, a ligand may be coordinately bonded to an outer peripheral portion of the shell. The ligand may be made of, for example, an organic material such as a thiol or an amine.

The particle diameters of the quantum dots 16r, 16g, 16b may be, for example, approximately from 3 nm to 15 nm. The emission wavelengths (peak wavelengths) of the quantum dots 16r, 16g, 16b are controllable through the particle diameters. Therefore, the emission of light of each color (e.g., red, green, and blue) is achieved by controlling the particle diameters of the quantum dots 16r, 16g, 16b.

For instance, the quantum dots 16r, the quantum dots 16g, and the quantum dots 16b contain respective materials of the same basic composition and have different average particle diameters. In other words, for example, the quantum dots 16r have a larger average particle diameter than do the quantum dots 16g. In addition, the quantum dots 16g have a larger average particle diameter than do the quantum dots 16b.

Note that the quantum dots 16r, the quantum dots 16g, and the quantum dots 16b may contain respective materials of different basic compositions.

Note that in the present embodiment, the light-emitting layer 13rb, containing the plurality of quantum dots 16r and the plurality of quantum dots 16b that emit light of different colors, is described assuming that the light-emitting layer 13rb is a single layer. It should be understood that the light-emitting layer 13rb is not necessarily a single layer and may include a first layer containing the plurality of quantum dots 16r (either of the plurality of quantum dots 16r, 16b that emit light of different colors) and a second layer containing the plurality of quantum dots 16b (the remaining of the plurality of quantum dots 16r, 16b that emit light of different colors). Then, the light-emitting layer 13rb may include the first layer and the second layer either stacked in the thickness direction of the light-emitting layer 13rb or arranged next to each other in the direction perpendicular to the thickness direction of the light-emitting layer 13rb.

The hole transport layer 14r transports the holes injected from the second electrode 15 to the light-emitting layer 13rb. The hole transport layer 14g transports the holes injected from the second electrode 15 to the light-emitting layer 13g. The hole transport layer 14b transports the holes injected from the second electrode 15 to the light-emitting layer 13b.

The hole transport layer 14r is provided opposite the electron transport layer 12r across the light-emitting layer 13rb. In other words, the hole transport layer 14r is disposed between the second electrode 15 and the light-emitting layer 13rb. The hole transport layer 14g is provided opposite the electron transport layer 12g across the light-emitting layer 13g. In other words, the hole transport layer 14g is disposed between the second electrode 15 and the light-emitting layer 13g. The hole transport layer 14b is provided opposite the electron transport layer 12b across the light-emitting layer 13b. In other words, the hole transport layer 14b is disposed between the second electrode 15 and the light-emitting layer 13rb.

The hole transport layer 14r, the hole transport layer 14g, and the hole transport layer 14b are separated from each other by the banks 17. In other words, the hole transport layer 14r, the hole transport layer 14g, and the hole transport layer 14b are arranged next to each other across the banks 17 in a plan view.

The hole transport layers 14r, 14g, 14b may contain respective hole transport materials. The hole transport layers 14r, 14g, 14h may contain, for example, PEDOT:PSS (poly-ethylenedioxythiophenelpolystyrene sulfonate), PVK (poly-N-vinyl carbazole), TFB (poly [(9,9-dioctylfluorenyl-2,7-diyl)-co-(4,4'-(N-(4-sec-b utylphenyl)diphenylarnine))]), or poly-TPD (N,N-bis(4-butylphenyl)-N,N-bis(phenyl)-benzi-dine) or contain any combination of these materials.

The hole transport layers 14r, 14g, 14b may be formed by, for example, inkjet printing—based coating with different materials, vapor deposition using a mask, or photolithography. The hole transport layers 14r, 14g, 14b may each have a thickness of, for example, approximately from 1 nm to 100 nm, both inclusive.

The second electrode 15 injects holes to the hole transport layers 14r, 14g, 14b. The second electrode 15 is provided opposite the first electrodes 11r, 11g, 11b across the light-emitting 1.5 layers 13rb, 13g, 13b respectively. In other words, the second electrode 15 is stacked on the hole transport layers 14r, 14g, 14h and the banks 17. For instance, the second electrode 15 is a common electrode provided continuously across light-emitting elements 3R, 3G, 3B. For instance, the second electrode 15, provided as a common layer, is continuous across the entire display area of the display device 1.

For instance, the second electrode 15 is a transparent electrode that has a high transmittance to visible light. The transparent electrode that has a high transmittance to visible light may be made using, for example, ITO FLO, ZnO, AZO, or GZO. The second electrode 15 may be formed by, for example, sputtering or vapor deposition. Note that the transparent electrode is preferably made using, for example, a material that has a transmittance of 80% or higher to visible light.

In addition, a sealing layer (not shown) is provided on the second electrode 15. The sealing layer includes, for example, a first inorganic sealing layer covering the second electrode 15, an organic buffer layer overlying the first inorganic sealing layer (opposite the second electrode 15), and a second inorganic sealing layer overlying the organic buffer layer (opposite the first inorganic layer). The sealing layer prevents foreign materials such as water and oxygen from reaching the interior of the display device 1.

The first inorganic sealing layer and the second inorganic sealing layer may have either a monolayer structure using an inorganic, insulating material such as a silicon oxide layer, a silicon nitride layer, or a silicon oxynitride layer or a multilayer structure obtained by combining any of these layers. The first inorganic sealing layer and the second inorganic sealing layer may be formed by, for example, CND.

The organic buffer layer is a transparent resin layer that has a planarization effect and that is, for example, transparent to visible light. The organic buffer layer may be made of an organic material, such as an acrylic, that can be provided by printing or coating technology. In addition, a functional film (not shown) may be provided on the sealing layer. The functional film may have, for example, at least one of an optical compensation function, a touch sensor function, and a protection function.

The holes injected from the second electrode 15 to the hole transport layers 14r, 14g, 14b are further transported respectively from the hole transport layer 14r to the light-emitting layer 13rb, from the hole transport layer 14g to the light-emitting layer 13g, and from the hole transport layer 14b to the light-emitting layer 13b. In addition, the electrons injected from the first electrode 11r to the electron transport layer 12r are further transported from the electron transport layer 12r to the light-emitting layer 13rb. In addition, the electrons injected from the first electrode 11g to the electron transport layer 12g are further transported from the electron transport layer 12g to the light-emitting layer 13g. In addition, the electrons injected from the first electrode 11b to the electron transport layer 12b are further transported from the electron transport layer 12b to the light-emitting layer 13b.

Then, the holes and electrons transported to the light-emitting layers 13rb, 13g, 13b recombine in the quantum dots to produce excitons that transition from the excited state back to the ground state, so that the quantum dots can emit light. In other words, the quantum dots in the light-emitting layer 13rb emit red or blue light, the quantum dots in the light-emitting layer 13g emit green light, and the quantum dots in the light-emitting layer 13b emit blue light.

For instance, the display device 1 is a top-emission type where the light emitted by the light-emitting layers 13rb, 13g, 13b is passed through the hole transport layers 14r, 14g, 14b and the second electrode 15, so that the light can exit to the side opposite the array substrate 10 (upper side of the light-emitting layers 13rb, 13g, 13b in FIG. 1). Note that the display device 1 may be a bottom-emission type where the light emitted by the light-emitting layers 13rb, 13g, 13b is passed through the electron transport layers 12r, 12g, 12b, the first electrodes 11r, 11g, 11b, and the array substrate 10, so that the light can exit to the array substrate 10 side (lower side of the light-emitting layers 13rb, 13g, 13b in FIG. 1). When the display device 1 is a bottom-emission type, the second electrode 15 needs only to contain a reflective metal layer that has high reflectance to visible light, and the first electrodes 11r, 11g, 11b to be made using a transparent conductive layer that has a high transmittance to visible light.

Note that the layered structures of the light-emitting elements 3rb, 3g, 3b are not necessarily limited to those shown in FIG. 2. As an alternative example, the light-emitting elements 3rb, 3g, 3b may each include another functional layer. For instance, the light-emitting element 3rb may include, between the second electrode 15 and the hole transport layer 14r, a hole injection layer for increasing the efficiency of hole injection from the second electrode 15 to the hole transport layer 14r. In addition, for example, the light-emitting element 3g may include, between the second electrode 15 and the hole transport layer 14g, a hole injection layer for increasing the efficiency of hole injection from the second electrode 15 to the hole transport layer 14g. For instance, the light-emitting element 3b may include, between the second electrode 15 and the hole transport layer 14b, a hole injection layer for increasing the efficiency of hole injection from the second electrode 15 to the hole transport layer 14b. If the light-emitting elements 3rg, 3g, 3b each include a hole injection layer, the hole injection layers may be provided separately for the light-emitting elements 3rg, 3g, 3b in an insular manner or interconnected to form a continuous layer.

A description is given next of relationships between the voltage applied across, and the luminance of, the light-emitting layers 13rb, 13g, 13b with reference to EEGs. 3 to 5.

Figure 3:
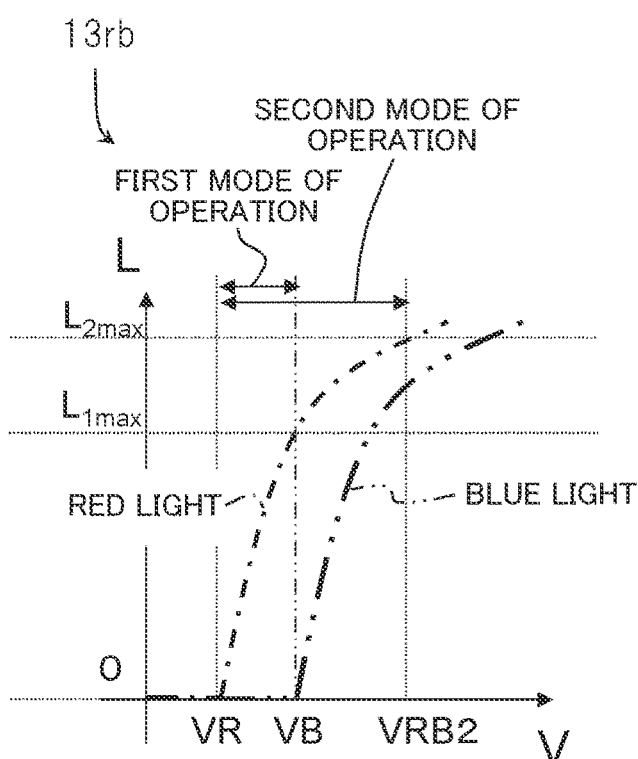
FIG. 3 is a schematic diagram representing relationships between the voltage applied across a light-emitting layer in a display device in accordance with an embodiment and the luminance of red-light-emitting quantum dots and blue-light-emitting quantum dots in the light-emitting layer.
Figure 4:
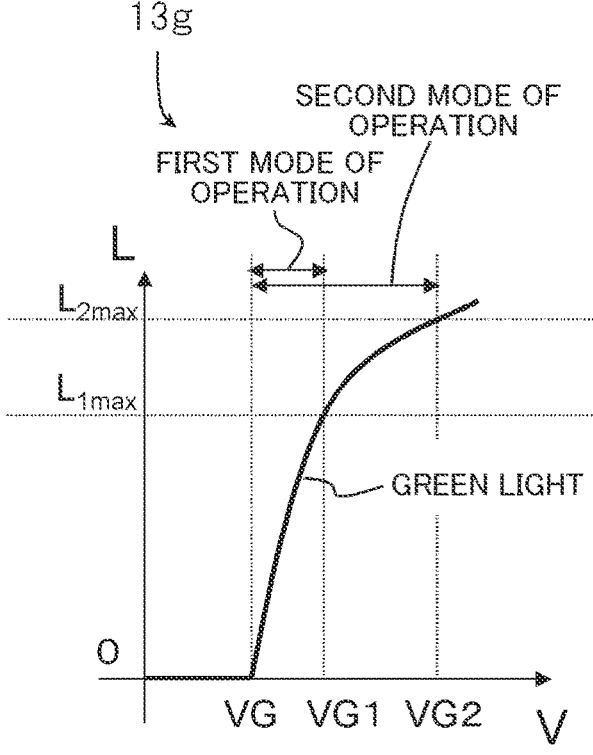
FIG. 4 is a schematic diagram representing a relationship between the voltage applied across a light-emitting layer in a display device in accordance with an embodiment and the luminance of green-light-emitting quantum dots in the light-emitting layer.
Figure 5:
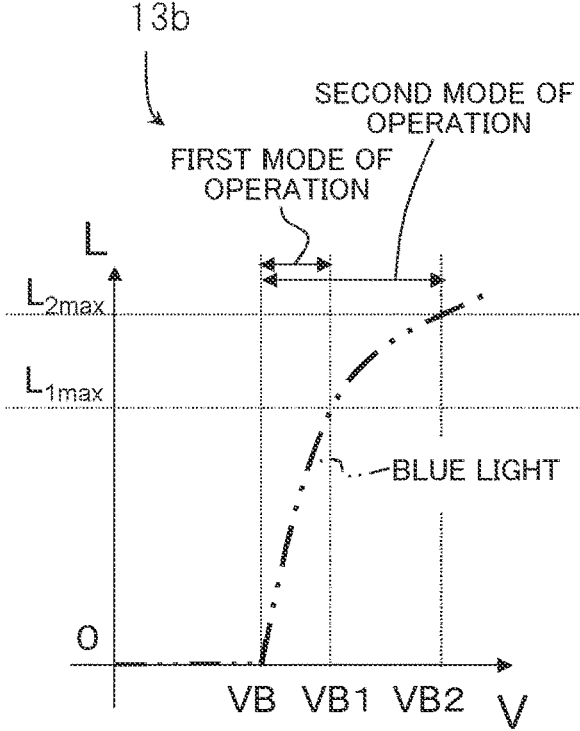
FIG. 5 is a schematic diagram representing a relationship between the voltage applied across a light-emitting layer in a display device in accordance with an embodiment and the luminance of blue-light-emitting quantum dots in the light-emitting layer.

FIG. 3 is a schematic diagram representing relationships between a voltage V applied across the light-emitting layer 13rb in the display device 1 in accordance with an embodiment and a luminance L of the red-light-emitting quantum dots 16r and the blue-light-emitting quantum dots 16b in the light-emitting layer 13rb. FIG. 4 is a schematic diagram representing a relationship between a voltage V applied across the light-emitting layer 13g in the display device 1 in accordance with an embodiment and a luminance L of the green-light-emitting quantum dots 16g in the light-emitting layer 13g. FIG. 5 is a schematic diagram representing a relationship between a voltage V applied across the light-emitting layer 13b in the display device 1 in accordance with an embodiment and a luminance L of the blue-light-emitting quantum dots 16b in the light-emitting layer 13b.

Of the voltages V applied across the light-emitting layers 13rb, 13g, 13b, the emission starting voltage under which the quantum dots 16r start emitting red light is referred to as the voltage VR, the emission starting voltage under which the quantum dots 16g start emitting green light as the voltage VG, and the emission starting voltage under which the quantum dots 16b start emitting blue light as the voltage VB.

In addition, of the voltages V, the voltage corresponding to a maximum value of the gray level for causing the quantum dots 16r in the light-emitting layer 13rb to emit light is referred to as the voltage VRB2, the voltage corresponding to a maximum value of the gray level for causing the quantum dots log in the light-emitting layer 13g to emit light as the voltage VG2, and the voltage corresponding to a maximum value of the gray level for causing the quantum dots 16b in the light-emitting layer 13b to emit light as the voltage VB2.

In addition, the luminance L of the quantum dots 16r in the light-emitting layer 13rb when the voltage VRB2 is applied across the light-emitting layer 13rb, the luminance L of the quantum dots 16g in the light-emitting layer 13g when the voltage VG2 is applied across the light-emitting layer 13g, and the luminance L of the quantum dots 16b in the light-emitting layer 13b when the voltage VB2 is applied across the light-emitting layer 13b are all referred to as the luminance $L_{2max}$.

Here, as shown in FIG. 3, in the light-emitting layer 13rb, since the quantum dots 16r have a smaller band gap than the quantum dots 16b, the voltage VB, which is the emission starting voltage of the quantum dots 16b, is higher than the voltage VR, which is the emission starting voltage of the quantum dots 16r (VR<VB).

Therefore, in the light-emitting layer 13rb, from the voltage VR to the voltage VB, the quantum dots 16r emit light in a luminance range of from 0 to $L_{1max}$ (the luminance of the light-emitting layer 13rb under the voltage VB). Hence, the light-emitting layer 13rb emits only red light.

Then, when a voltage greater than or equal to the voltage VR is applied across the light-emitting layer 13rb, the quantum dots 16b also start emitting blue light as well as the quantum dots 16r. Hence, in the light-emitting layer 13rb, from the voltage VB to the voltage VRB2, the quantum dots 16r emit red light in a luminance range of from $L_{1max}$ to $L_{2max}$, and the quantum dots 16b also emit blue light at the luminance corresponding to the applied voltage. In other words, the light-emitting layer 13rb emits light of a mixed color of red and blue from the voltage VB to the voltage VRB2. The luminance $L_{1max}$ is a maximum limit of the luminance of the quantum dots 16r When only the quantum dots 16r, out of the quantum dots 16r, 16b, emit light in the light-emitting element 3rb.

Accordingly, when displaying an image in the first display mode (normal mode) in which peeping from oblique directions is not restricted, the display device 1 emits only red light in the luminance range of from 0 inclusive to $L_{1max}$ exclusive by the light-emitting layer Deb emitting light under a voltage of from VR inclusive to VB exclusive.

In addition, when displaying an image in the first display mode, the display device 1 likewise supplies, to the light-emitting layers 13g, 13b, a voltage not exceeding an upper limit that is lower than the voltages VG2, VB2 corresponding to the luminance $L_{2max}$ to strike a balance with the luminance of the light-emitting layer 13rb.

In other words, when displaying an image in the first display mode, the display device 1 emits green light in a luminance range of from 0 to $L_{1max}$ exclusive by the light-emitting layer 13g emitting light under a voltage of from VG inclusive to VG1 exclusive corresponding to the luminance $L_{1max}$ (VG<VG1<VG2). In addition, when displaying an image in the first display mode, the display device 1 emits blue light in a luminance range of from 0 to $L_{max}$ exclusive by the light-emitting layer 13b emitting light under a voltage of from VB inclusive to VIII exclusive corresponding to the luminance $L_{1max}$ (VB<VB1<VB2).

For voltages between the voltage VG and the voltage VG1 for the light-emitting layer 13g, the relationship between the voltage V(VG<V<VG1) and the luminance L is determined in advance, and the voltage V is determined that corresponds to the required luminance L, for driving. Similar procedures apply to the light-emitting layer 13b.

In addition, when displaying an image in the second display mode (peep restricting mode) in which peeping from oblique directions is restrained, the display device 1 emits red light in a luminance range of from 0 to $L_{2max}$, both inclusive, by the light-emitting layer 13rb emitting light under a voltage of from, VR to VRB2, both inclusive, and emits blue light in addition to red light under a voltage of from VB to VB2.

In addition, when displaying an image in the second display mode, the display device 1 emits green light in a luminance range of from 0 to $L_{2max}$ inclusive by the light-emitting layer 13g emitting light under a voltage of from VG to VG2, both inclusive. In addition, when displaying an image in the second display mode, the display device 1 emits blue light in a luminance range of from 0 to $L_{2max}$ inclusive by the light-emitting layer 13b emitting light under a voltage of from VB to VB2, both inclusive.

Here, since the light-emitting layer 13rb emits red and blue light, the difference between the emission starting voltage VR and the emission starting voltage VB can be rendered larger than the difference between the emission starting voltage VR and the emission starting voltage VG. Therefore, it is easier to control the emission of red and blue light than when the light-emitting layer 13rb emits red and green light. In other words, it is possible to stably control the emission of red and blue light by the light-emitting layer 13rb.

Note that the light-emitting layer 13rb may emit red and violet light instead of emitting red and blue light. This particular arrangement enables an even larger difference between the emission starting voltage VR and the emission starting voltage for the violet light, which in turn renders it even easier to control the emission of red and violet light. In other words, it becomes possible to more stably control the emission of red and violet light by the light-emitting layer 13rb.

Figure 6:
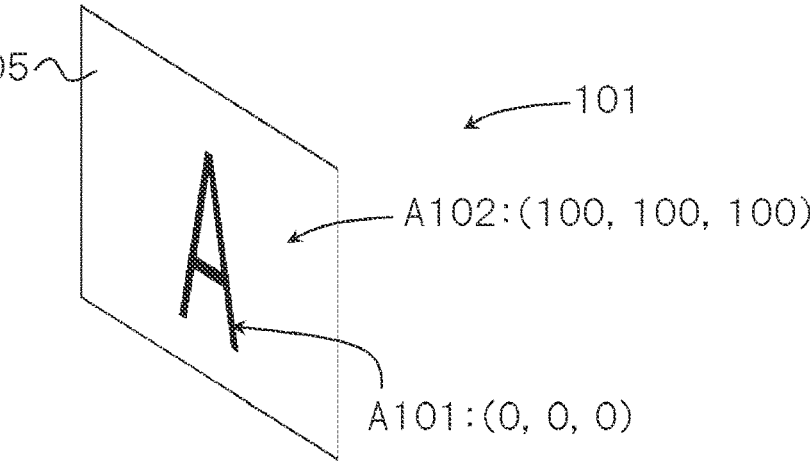
FIG. 6 is a diagram showing an image displayed in a display area of a display device in accordance with a comparative example, as viewed normal to the display area by a user.

FIG. 6 is a diagram showing an image displayed in a display area 105 of a display device 101 in accordance with a comparative example, as viewed normal to the display area 105 (front direction) by the user. FIG. 7 is a diagram showing an image displayed in the display area 105 of the display device 101 in accordance with the comparative example, as viewed from a direction inclined to the normal to the display area 105 (oblique direction) by the user.

The display area 105 of the display device 101 shown in FIGS. 6 and 7 has a matrix of pixels including red pixels that are red-light-emitting subpixels, green pixels that are green-light-emitting subpixels, and blue pixels that are blue-light-emitting subpixels. Note that the red pixels in the display device 101 contain, for example, only a red-light-emitting material, and no blue-light-emitting material, as the light-emitting material.

Retiring to FIG. 6, for example, an image including a black letter "A" on a white background image is displayed in the display area 105 of the display device 101. Letting the luminance of the image displayed in the display area 105 be represented in the form "(red light luminance, green light luminance, blue light luminance)," the pixels for the letter "A" have a luminance A101 of (0,0,0), and the white background image has a luminance A102 of (100,100,100), when the display area 105 is viewed from the front direction.

In addition, as shown in FIG. 7, for example, even when the display area 105 is viewed from an oblique direction by the user, the pixels for the letter "A" have a luminance A101 of (0,0,0), and the white background image has a luminance A102 of (100,100,100). As described here, in the display device 101, the letter "A" is visually recognizable almost equally when the image displayed in the display area 105 is viewed from the front direction as shown in FIG. 6 and when the image displayed in the display area 105 is viewed from an oblique direction as shown in FIG. 7. Therefore, in the display device 101, the letter or like image displayed in the display area 105 is visually recognized easily, for example. When viewed by another person from a direction inclined to the normal to the display area 105 (oblique direction). In other words, in the display device 101 in accordance with the comparative example, other persons can easily peep at the image displayed in the display area 105 from oblique directions.

Figure 8:
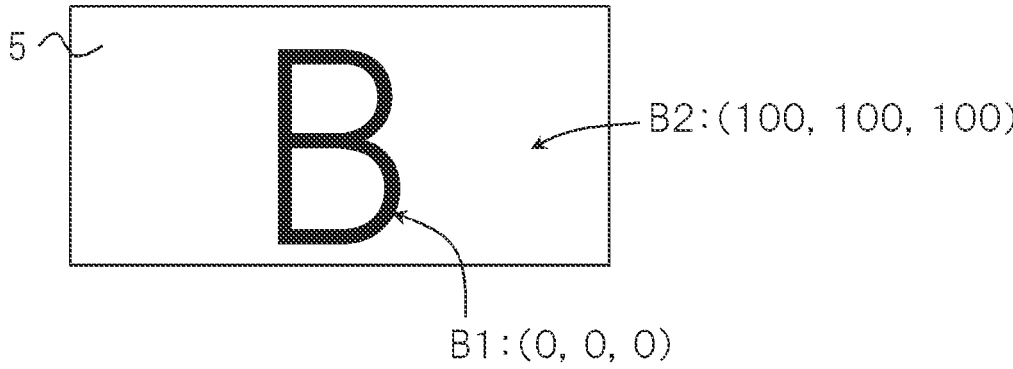
FIG. 8 is a diagram showing an image displayed in a display area of a display device in accordance with an embodiment a second display mode, as viewed normal to the display area by a user.
Figure 9:
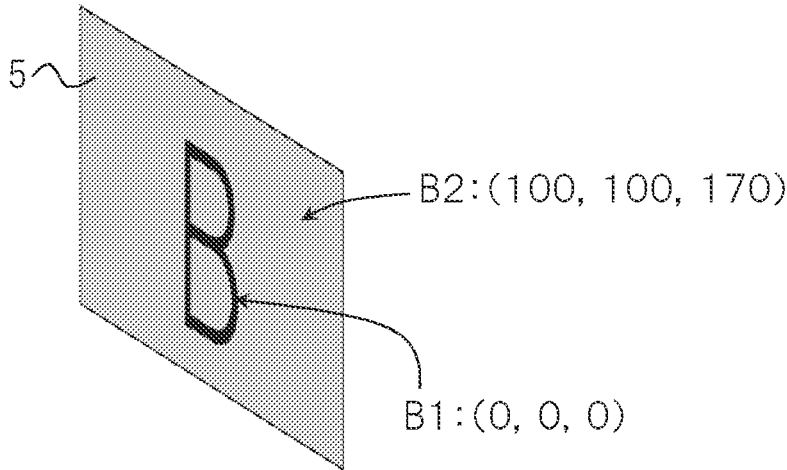
FIG. 9 is a diagram showing an image displayed in the display area of the display device in accordance with the embodiment in the second display mode, as viewed from a direction inclined to the normal to the display area by a user.

FIG. 8 is a diagram showing an image displayed in the display area 5 of the display device 1 in accordance with an embodiment in the second display mode (peep restricting mode), as viewed normal to the display area 5 (front direction) by the user. FIG. 9 is a diagram showing an image displayed in the display area 5 of the display device 1 in accordance with the embodiment in the second display mode (peep restricting mode), as viewed from a direction inclined to the normal to the display area 5 (oblique direction) by the user.

Referring to FIG. 8, for example, an image including a black letter "B" on a white background image is displayed in the display area 5 of the display device 1. Letting the luminance of the image displayed in the display area. 5 be represented in the form of "(red light luminance L, green light luminance L, blue light luminance L)," the image of the letter "B" has a luminance B1 of (0,0,0), and the white background image has a luminance B2(L) of (100,100,100), when, for example, the display area 5 is viewed from the front direction by the user.

In contrast, as shown in NG. 9, when the display area 5 is viewed from an oblique direction, the image of the letter "B" has a luminance B1 of (0,0,0), but the white background image has a luminance B2 of for example, (100,100,170). Therefore, the background image, which appears white when the display area 5 is viewed from the front direction, appears more bluish, for example, to the user viewing from the oblique direction than to the user viewing from the normal direction.

For instance, in the display device 1, the red pixel PXrb emits blue light with a luminance of 70 as well as red light with a luminance of 100, the green pixel PXg emits green light with a luminance of 100, and the blue pixel PXb emits blue light at a luminance of 100. In other words, the luminance 170 of blue light is the sum of the luminance 70 of the blue light emitted by the red pixel PXrb and the luminance 100 of the blue light emitted by the blue pixel PXb.

In addition, in the display device 1, the light-emitting element 3rb is structured such that for blue light, the light intensity after the interference of the direct light from the light-emitting layer 13rb and the reflection light from the light-emitting layer 13rb is higher when the user, for example, views from a direction inclined to the normal to the display area 5 than when the user views normal to the display area 5.

Therefore, in the display device 1, as shown in FIG. 8, for example, when the user views the display area 5 from the front direction, the background image displayed as being white (background image where blue light has a luminance of 100), as shown in FIG. 9, appears as a background image that is bluish rather than white (background image where blue light has a luminance of 170) when the display area 5 is viewed obliquely.

As described here, in the display device 1, when displaying an image in the second display mode, blue light is enhanced across the entire image displayed in the display area 5 when viewed obliquely over when viewed from the front direction, which reduces visual recognizability. The display device 1 can hence restrict, for example, other persons peeping from oblique directions.

Note that as shown in FIGS. 3 to 5, the luminances of the light-emitting layers 13rb, 13g, 13b have an upper limit of $L_{1max}$ when the display device 1 displays an image in a first mode of operation, whereas the luminances of the light-emitting layers 13rb, 13g, 13b have an upper limit beyond $L_{1max}$ and beyond $L_{1max}$ or $L_{2max}$ when the display device 1 displays an image in a second mode of operation. Therefore, the luminance when the display device 1 displays a white image in the second mode of operation is slightly higher than the luminance when the display device 1 displays a white image in the first mode of operation.

It should be understood that an image containing confidential information is often an image in a text form (image of lines of letters or characters on a background image) and that the background image is often white. Therefore, high levels of luminance are less problematic when the display device 1 displays a white image in the second mode of operation than in the first mode of operation.

In addition, since image containing confidential information often includes an entirely white background image, the entire background image appears bluish when the background image is viewed from an oblique direction rather than when viewed from the front direction. Therefore, the visual recognizability of text images as viewed from oblique directions can be reduced overall. Therefore, it is possible to overall restrain other persons from peeping from oblique directions at the image containing confidential information displayed in the display area 5.

Note that in the display device 1, similarly to the cases shown in FIGS. 6 and 7, when an image is displayed in the display area 5 in the first display mode in which peeping from oblique directions is not restricted, the visual recognizability of the letter "B" does not substantially change, so that the letter "B" is recognizable, regardless of, for example, whether the user views normal to the display area 5 or from an oblique direction.

Figure 10:
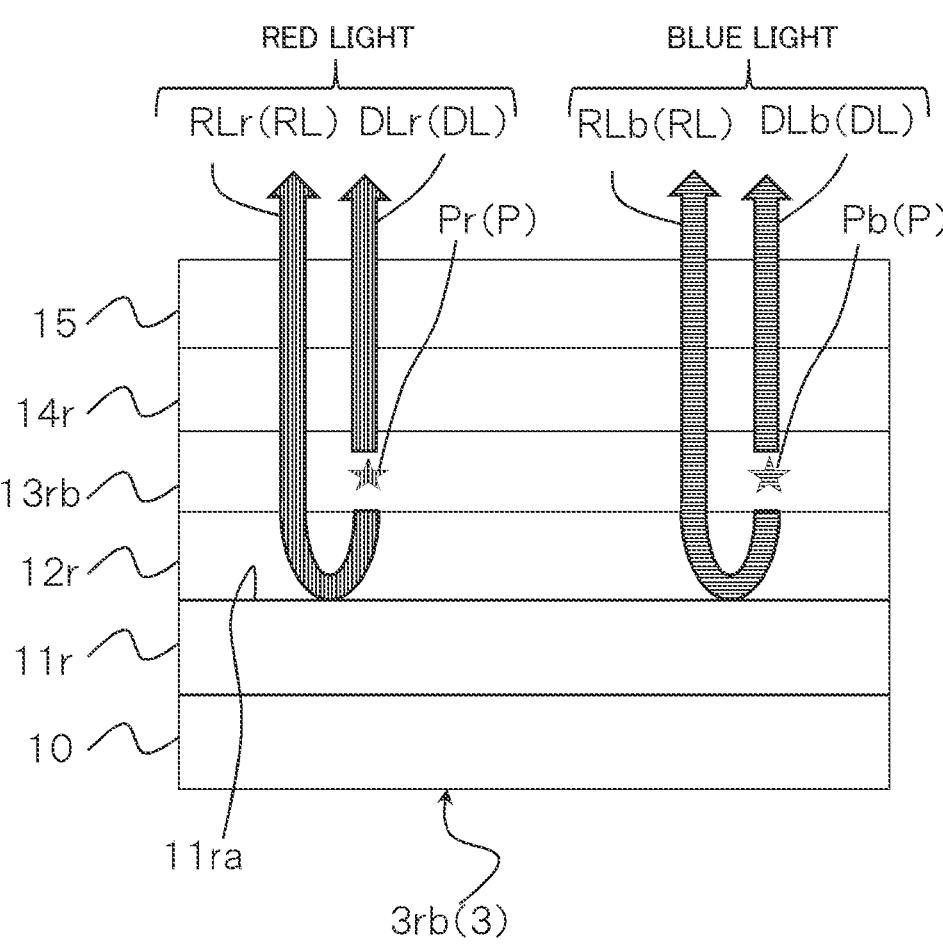
FIG. 10 is a schematic diagram illustrating the red light emitted by quantum dots and directly exiting a light-emitting element in accordance with an embodiment ("direct light"), the red light emitted by the quantum dots and exiting the light-emitting element after being reflected ("reflection light"), the blue light emitted by quantum dots and directly exiting the light-emitting element ("direct light"), and the blue light emitted by the quantum dots and exiting the light-emitting element after being reflected ("reflection light").

FIG. 10 is a schematic diagram illustrating the red light emitted by the quantum dots 16r (FIG. 2) and directly exiting a light-emitting element 13rb in accordance with an embodiment ("direct light DLr"), the red light emitted b r the quantum dots 16r and exiting the light-emitting element 13rb after being reflected ("reflection light RLr"), the blue light emitted by the quantum dots 16b (FIG. 2) and directly exiting the light-emitting element 13rb ("direct light DLb"), and the blue light emitted by the quantum dots 16b and exiting the light-emitting element 13rb after being reflected ("reflection light RLb"). Referring to FIG. 10, the red light emitted by the light-emitting layer 13rb (specifically, the red light emitted by the quantum dots 16r (FIG. 2) in the light-emitting layer 13rb) includes the direct light DLr and the reflection light RLr. The blue light emitted by the light-emitting layer 13rb (specifically, the blue light emitted by the quantum dots 16b (FIG. 2) in the light-emitting layer 13rb) includes the direct light DLb and the reflection light RLb.

Letting a light-emitting point Pr be a point in the light-emitting layer 13rb, located anywhere in the thickness direction of the light-emitting layer 13rb, the direct light Ins in the red light emanates from the light-emitting point Pr and transmits through the hole transport layer 14r and the second electrode 15 before exiting the light-emitting element 3rb. In other words, the direct light DLr transmits directly through the second electrode 15 without reflecting off the reflective surface 11ra of the first electrode 11r.

The reflection light RLr in the red light emanates from the light-emitting point Pr, transmits through the electron transport layer 12r, reflects off the reflective surface 11ra of the first electrode 11r, transmits again through the electron transport layer 12r, and further transmits through the light-emitting layer 13rb, the hole transport layer 14r, and the second electrode 15 before exiting the light-emitting element 3rb.

Letting a light-emitting point Pb be a point in the light-emitting layer 13rb, located anywhere in the thickness direction of the light-emitting layer 13rb, the direct light DLb in the blue light emanates from the light-emitting point Pb and transmits through the hole transport layer 14r and the second electrode 15 before exiting the light-emitting element 3rb. In other words, the direct light DLb transmits directly through the second electrode 15 without reflecting off the reflective surface 11ra of the first electrode 11r.

The reflection light RLb in the blue light emanates from the light-emitting point Pb, transmits through the electron transport layer 12r, reflects off the reflective surface 11ra of the first electrode 11r, transmits again through the electron transport layer 12r, and further transmits through the light-emitting layer 13rb, the hole transport layer 14r, and the second electrode 15 before exiting the light-emitting element 3rb.

Note that throughout the following description, the direct light DLr in the red light and the direct light DLb in the blue light may be referred to as the direct light DL when there is no need to distinguish between the direct light DLr and the direct light DLb. In addition, the reflection light RLr in the red light and the reflection light RLb in the blue light may be referred to as the reflection light RL when there is no need to distinguish between the reflection light RLr and the reflection light RLb. In addition, the light-emitting point Pr for the red light and the light-emitting point Pb for the blue light may be referred to as the light-emitting point P when there is no need to distinguish between the light-emitting point Pr and the light-emitting point Pb.

Here, the intensity of the light emitted by the light-emitting element 13$rb$ is the sum of the intensity of the light produced by the interference of the reflection light RL having reflected off the reflective surface 11$ra$ and transmitted through the second electrode 15 and the direct light DL having transmitted through the second electrode 15 without reflecting off the reflective surface 11$ra$. The intensity of the light emitted by the light-emitting element 13$rb$ fluctuates with interference conditions such as the phase difference between the direct light DL and the reflection light RL.

For example, the red light emitted by the light-emitting element 13$rb$ develops, between the direct light DLr and the reflection light RLr, a phase difference (in other words, an optical path length difference) that changes with the direction in which the red light is emitted by the light-emitting element 13$rb$. This phase difference causes the red light emitted by the light-emitting element 13$rb$ to change intensity.

In addition, for example, the blue light emitted by the light-emitting element 13$rb$ develops, between the direct light DLb and the reflection light RLb, a phase difference (in other words, an optical path length difference) that changes with the direction in which the blue light is emitted by the light-emitting element 13$rb$. This phase difference causes the blue light emitted by the light-emitting element 13$rb$ to change intensity.

Here, for example, when the display device 1 is applied to an electronic apparatus capable of displaying images including a mobile information terminal such as a smartphone or a laptop computer (personal computer), the user often views the image displayed in the display area from the normal to the display area 5 or a direction slightly inclined to the normal to the display area 5. Therefore, when displaying an image in the second display mode, the display device 1, of the red and blue light emitted by the light-emitting element 3$rb$, preferably relatively enhances the intensity of the red light and relatively mitigates the intensity of the blue light in the normal to the display area 5 (front direction). Hence, the user can clearly recognize the image displayed in the display area 5 from the normal to the display area 5 or a direction slightly inclined to the normal to the display area 5.

Particularly, quantum dots have an emission wavelength that has a narrower full width at half maximum than organic EL (OLEDs), have a larger interference effect when the interference conditions of the direct light TL and the reflection light RL change, and allow more efficient control of the intensity of light. For instance, when the quantum dots 16$r$ have an emission wavelength $\lambda_{red}$ of 620 nm, the full width at half maximum is approximately 60 nm. In addition, for example, when the quantum dots 16$b$ have an emission wavelength $\lambda_{blue}$ of 465 nm, the full width at half maximum is approximately 50 nm.

A description is given next of the intensity of red and blue light in the normal to the reflective surface 11$ra$. Note that the normal to the reflective surface 11$ra$ matches the normal to the display area 5 (FIG. 1).

For instance, both the reflection light RLr, RLb respectively in the red and blue light exiting the light-emitting element 3$rb$ have the phase thereof reversed by 180° with respect to the direct light DLr, DLb upon being reflected by the reflective surface 11$ra$. In other words, the reflection light RLr in the red light has the phase thereof reversed by 180° with respect to the phase of the direct light DLr upon being reflected by the reflective surface 11$ra$ of the first electrode 11$r$. In addition, the reflection light RLb in the blue light has the phase thereof reversed by 180° with respect to the phase of the direct light DLb upon being reflected by the reflective surface 11$ra$ pf the first electrode 11$r$.

Therefore, in the red light emanating from the light-emitting point Pr and exiting the light-emitting element 3$rb$, the direct light DLr and the reflection light RLr reinforce if the direct light DLr and the reflection light RLr have an optical path length difference that is equal to an odd multiple of one half wavelength, so that the red light extracted in the front direction of the light-emitting element 3$rb$ (normal to the reflective surface 11$ra$) has a high intensity.

In contrast, in the red light emanating from the light-emitting point Pr and exiting the light-emitting element 3$rb$, the red light extracted in the front direction of the light-emitting element 3$rb$ has a low intensity if the direct light DLr and the reflection light RLr have an optical path length difference that is equal to an even multiple of one half wavelength, that is, an integral multiple of one wavelength. In other words, if the direct light DLr and the reflection light RLr have an optical path length difference that is equal to an even multiple of one half wavelength, the red light has a higher intensity in directions inclined to the normal to the display area 5 than in the normal direction.

In addition, in the blue light emanating from the light-emitting point Pb and exiting the light-emitting element 3$rb$, the direct light DLb and the reflection light RLb reinforce if the direct light DLb and the reflection light RLb have an optical path length difference that is equal to an odd multiple of one half wavelength, so that the blue light extracted in the front direction of the light-emitting element 3$rb$ has a high intensity.

In contrast, in the blue light emanating from the light-emitting point Pb and exiting the light-emitting element 3$rb$, the blue light extracted in the front direction of the light-emitting element 3$rb$ has a low intensity if the direct light DLb and the reflection light RLb have an optical path length difference that is equal to an even multiple of one half wavelength, that is, an integral multiple of one wavelength. In other words, if the direct light DLb and the reflection light RLb have an optical path length difference that is equal to an even multiple of one half wavelength, the blue light has a higher intensity n oblique directions inclined to the normal to the display area 5 than in the normal direction.

Figure 11:
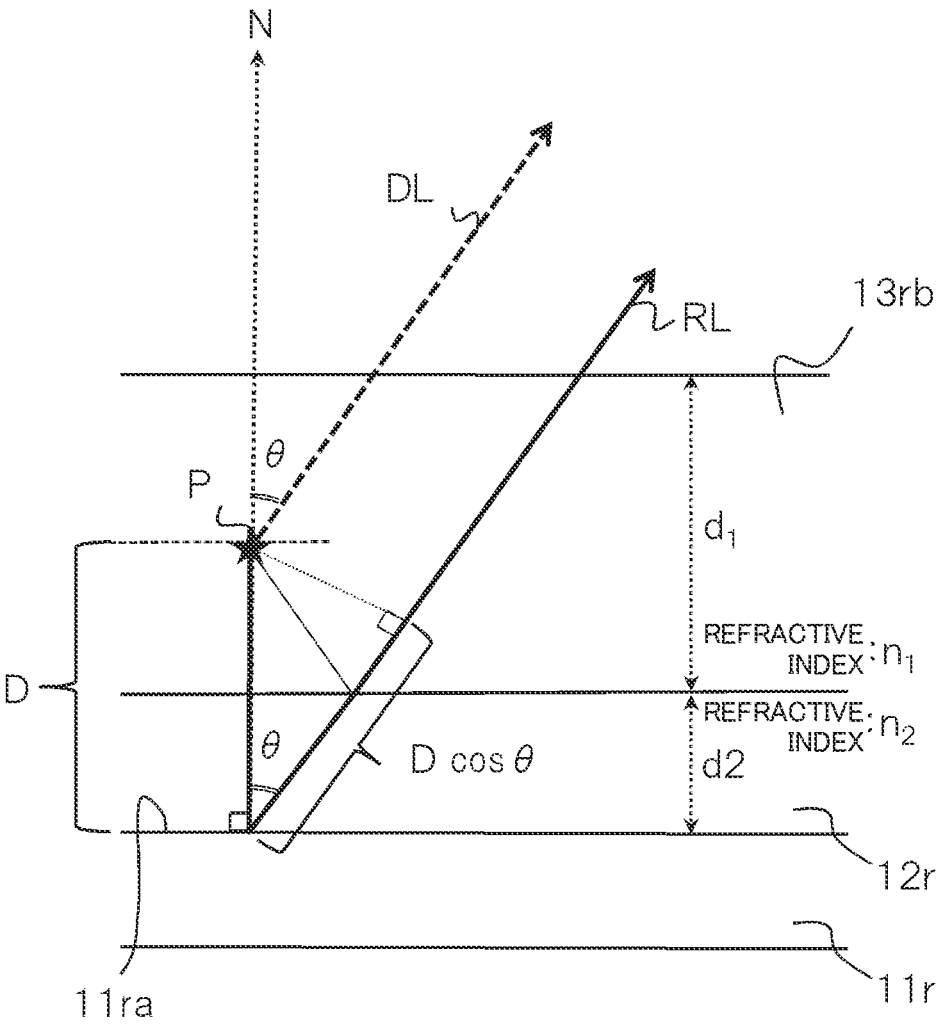
FIG. 11 is a diagram illustrating interference conditions of a direct light beam and a reflection light beam coming from a light-emitting point in a light-emitting layer.

FIG. 11 is a diagram illustrating interference conditions of the direct light DL: and the reflection light RL both emanating from the light-emitting point P in the light-emitting layer 13$rb$.

In this example, the light-emitting point P is the thickness-wise midpoint of the light-emitting layer 13$rb$. In addition, the normal to the reflective surface 11$ra$ of the first electrode 11$r$ is denoted by N. In addition, the optical path length difference from the light-emitting point P to the reflective surface 11$ra$ is denoted by D.

When viewed normal N to the reflective surface 11$ra$, the direct light DL emanating from the light-emitting point P and the reflection light RL emanating from the light-emitting point P and reflecting off the reflective surface 11$ra$ have an optical path length difference equal to D.

Then, the light-emitting layer 13*rb* is assumed to have a thickness of $d_1$ and a refractive index of $n_1$. The electron transport layer 12*r* is assumed to have a thickness of $d_2$ and a refractive index of $n_2$.

The optical path length difference D between the direct light DL and the reflection light RL when viewed normal N to the reflective surface 11*ra* is given by mathematical expression 1 below.

$$\text{Optical Path Length Difference: } D=2(n_1 d_1 \text{ ... }) \qquad \text{(Mathematical Expression 1)}$$

This example assumes that light emanates from the midpoint of the thickness d1 of the light-emitting layer. This is however not the only possibility as will be detailed later.

Then, when the direct light DL interferes constructively with the reflection light RL, the intensity of light is proportional to mathematical expression 2 below, where $\lambda$ is the wavelength of light.

$$\sin^2(\pi D/\lambda) \qquad \text{(Mathematical Expression 2)}$$

Taking it into consideration that the reflection light RL has the phase thereof reversed by 180° with respect to the direct light DL upon being reflected by the reflective surface 11*ra*, the reflection light RL interferes constructively with the direct light DL when the optical path length difference D is equal to an odd multiple of one half wavelength and destructively with the direct light DL when the optical path length difference D is equal to an even multiple of one half wavelength.

In other words, when $\pi D/\lambda=(2a+1)\pi/2$, in other words, when the optical path length difference D is given by mathematical expression 3 below, the direct light DL and the reflection light RL reinforce in interference.

$$\text{Optical Path Length Difference: } D=(2a+1)\lambda/2 \qquad \text{(Mathematical Expression 3)}$$

where the variable a is equal to 0 or a positive integer.

In addition, when $\pi D/\lambda=b\pi$, in other words, when the optical path length difference D is given by mathematical expression 4 below, the direct light DL and the reflection light RL subtract.

$$\text{Optical Path Length Difference: } D=b\lambda \qquad \text{(Mathematical Expression 4)}$$

where the variable b is a positive integer.

For the normal N to the reflective surface 11*ra*, a variable a is selected from mathematical expression 3 such that the direct light DL and the reflection light in the red light reinforce, and a variable b is selected from mathematical expression 4 such that the direct light DL and the reflection light in the blue light subtract. Then, on the basis of the obtained optical path length difference D, the thickness $d_1$ of the light-omitting; layer 13*rb*, the thickness $d_2$ of the electron transport layer 12*r*, the refractive index m of the light-emitting layer 13*rb*, and the refractive index $n_2$ of the electron transport layer 12*r* are specified. Hence, the intensity of the red light can be relatively increased, and intensity of the blue light can be relatively decreased, for the normal N to the reflective surface 11*ra*. The resultant display device 1 allows the user to visually recognize the image displayed in the display area 5 from the normal N to the reflective surface 11*ra* and additionally hampers, for example, other persons in visually recognizing the image from directions inclined to the normal N, in other words, restricts peeping from oblique directions.

Here, the light-emitting layer 13*rb* emits red and blue light that have relatively different peak wavelengths in comparison with, for example, when red and green light are emitted. Therefore, in mathematical expressions 3 and 4 above, interference conditions can be easily selected that vary depending on wavelength, and the visual recognizability when viewed from oblique directions can be readily rendered different for red and blue light. Hence, peeping from Oblique directions can be efficiently restricted by reducing the visual recognizability of an image from oblique directions without reducing the visual recognizability of an image from the front direction.

Note that the light-emitting layer 13*rb* may emit red and violet light that have more different peak wavelengths instead of emitting red and blue light. Thus, peeping from oblique directions can be efficiently restricted by more efficiently reducing the visual recognizability when viewed from oblique directions.

As a specific example, for example, red light has a peak wavelength $\lambda_{red}$ of 620 nm, and blue light has a peak wavelength $\lambda_{red}$ of 465 nm.

Letting the variable a be equal to 1 in mathematical expression 3, the optical path length difference D at which red light reinforces is calculated as in the following.

$$D=(2\times1+1)\times(620/2)=930 \text{ nm.}$$

In addition, letting the variable b be equal to 2 in mathematical expression 4, the optical path length difference D at which blue light subtracts is calculated as in the following.

$$D=2\times465=930 \text{ nm.}$$

Then, letting both $n_1$ and $n_2$ be equal to 2, $d_1$ be equal to 30 nm, and the light-emitting point P represent the thickness-wise midpoint of the light-emitting layer 13*rb*, the thickness dr, of the electron transport layer 12*r* is calculated as in the following using mathematical expression 1.

$$930=2((2\times30)/2+2d_2), \text{ and}$$

$$d\approx200 \text{ nm.}$$

In this manner, letting the thickness $d_2$ of the electron transport layer 12*r* be substantially equal to 200 nm, for example, the user can clearly recognize the image displayed in the display area 5 from the normal N to the reflective surface 11*ra*. In addition, since the intensity of the blue light produced by the interference of the direct light DLb and the reflection light RLb is higher for oblique directions inclined to the normal N than the intensity of the red light produced by the interference of the direct light DLr and the reflection light RLr and for the normal N to the reflective surface 11*ra*, for example, peeping of the image by other persons can be restricted.

In addition, for example, let the wavelength $\lambda_{red}$ be equal to 620 nm and the full width at half maximum of the wavelength $\lambda_{red}$ be equal to 60 nm. In addition, for example, let the wavelength be equal to 465 nm and the full width at half maximum of the wavelength $\lambda_{blue}$ be equal to 50 nm. If the wavelength $\lambda_{red}$ and the wavelength $\lambda_{blue}$ vary by approximately 10%, the following inequalities hold. Note that $\lambda 1=\lambda_{red}$ and $\lambda 2=\lambda_{blue}$.

$$0.9\leq n_1 d_1/\{(a+\frac{1}{2})\times\lambda_1\}\leq 1.1, \text{ and } 0.9\leq n_2 d_2/\{(b)\times\lambda_2\}\leq 1.1$$

A description is given next of the intensity of the red light and the intensity of the blue light in oblique directions. Let the variable a be equal to 1 and $\pi D/\lambda$ be equal to $3\pi/2$ for the red light, and the variable b be equal to 2 and $\pi D/\lambda$ be equal to $2\pi$ for the blue light, as described above.

Then, the optical path length difference is equal to Dcos $\theta$ when the direct light DL and the reflection light RL are inclined by an angle of inclination $\theta$ to the normal N to the reflective surface 11*ra*. Therefore, when the direct light DL and the reflection light RL in oblique directions reinforce in interference, the light intensity is given by mathematical expression 5 below.

$$\sin^2\{(\pi D)/\lambda\}\times\cos\theta \qquad \text{(Mathematical Expression 5)}$$

From mathematical expression 5, as an example, the red light is assumed to have an alignment property given by mathematical expression 6 below, and the blue light is assumed to have an alignment property given by mathematical expression 7 below.

$$\sin^2(1.5\pi\cos\theta) \qquad \text{(Mathematical Expression 6)}$$

$$\sin^2(2\pi\cos\theta) \qquad \text{(Mathematical Expression 7)}$$

In addition, as a comparative example in which interference conditions for direct and reflection light are not taken into consideration, a light-emitting element is assumed to emit red light that has an alignment property given by mathematical expression 8 below and blue light that has an alignment property given by mathematical expression 9 below Note that the light-emitting element in accordance with the comparative example represented by mathematical expressions 8, 9 is assumed to meet the condition "$\pi D/\lambda=\pi/2$" where the direct and reflection light in blue light reinforce in interference in the normal to the reflective surface.

$$\sin^2(0.375\pi\cos\theta) \qquad \text{(Mathematical Expression 8)}$$

$$\sin^2(0.5\pi\cos\theta) \qquad \text{(Mathematical Expression 9)}$$

Figure 12:
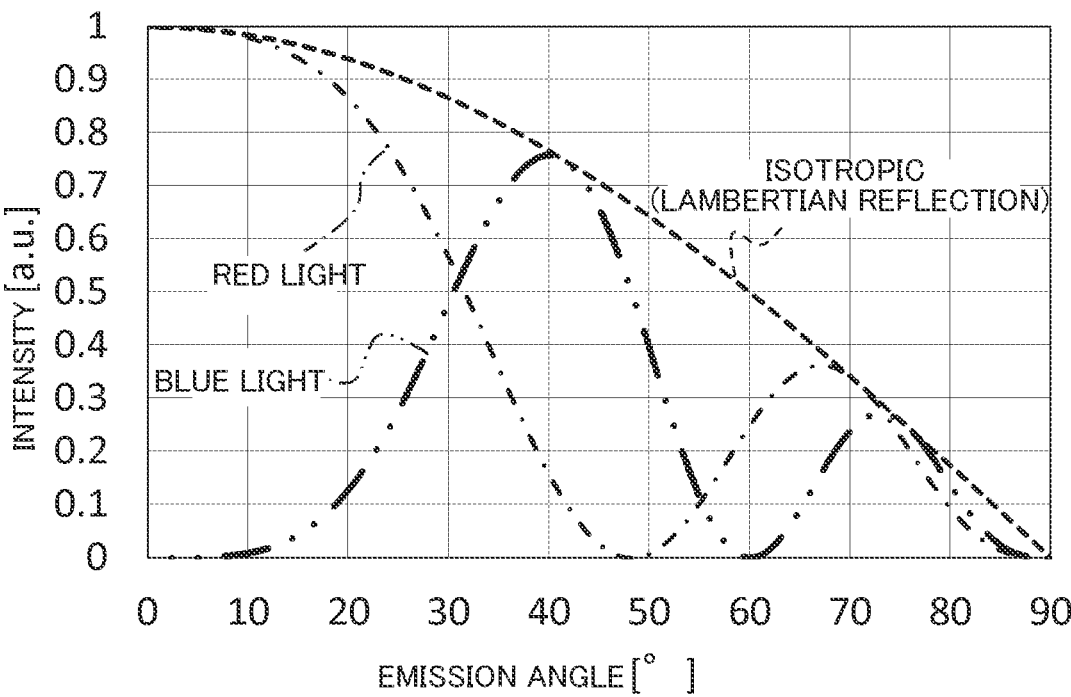
FIG. 12 is a diagram representing the intensity of red and blue light for various emission angles in a light-emitting element in accordance with an embodiment.
Figure 13:
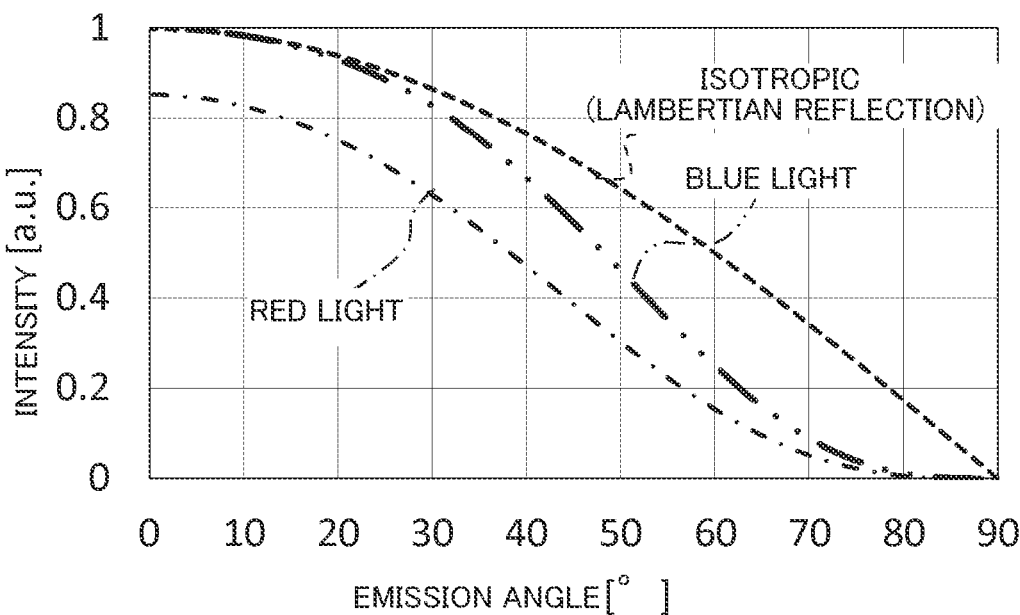
FIG. 13 is a diagram representing the intensity of red and blue light for various emission angles in a light-emitting element in accordance with a comparative example.

FIG. 12 is a diagram representing the intensity of red and blue light for various emission angles in the light-emitting element 3$rb$ in accordance with an embodiment. FIG. 13 is a diagram representing the intensity of red and blue light for various emission angles in a light-emitting element in accordance with the comparative example.

In FIG. 12, the alignment property of red light represented by mathematical expression 6 above is indicated by a dash-dot line, and the alignment property of blue light represented by mathematical expression 7 above is indicated by a dash-double-dot line. In FIG. 13, the alignment property of red light represented by mathematical expression 8 above is indicated by a dash-dot line, and the alignment property of blue light represented by mathematical expression 9 above is indicated by a dash-double-dot line.

In both FIGS. 12 and 13, the horizontal axis represents an angle of inclination θ as an emission angle [°] of from 0° to 90°, and the vertical axis represents the intensity of the light produced by the constructive interference of the direct and reflection light in red and blue light. Both FIGS. 12 and 13 show the intensity of the light produced by the constructive interference of the direct and reflection light in the normal to the reflective surface when the emission angle is 0° and show the intensity of the light produced by the constructive interference of the direct and reflection light in directions inclined to the normal to the reflective surface when the emission angle is from 0° exclusive to 90° inclusive. In addition, in both FIGS. 12 and 13, for comparison, a dotted line indicates the intensity of light that follows Lambertian reflection for various emission angles [°].

In the comparative example shown in FIG. 13, the intensity of the light produced by the interference of the direct and reflection light in both the red and blue light is a maximum when the emission angle is 0° and decreases with the emission angle changing from 0° to 90°. Therefore, in the display device in accordance with the comparative example, the image displayed in the display area is visually recognizable regardless of whether the image is viewed normal to the display area or viewed from directions inclined to the normal. It is hence understood that peeping from oblique directions is not restricted.

Meanwhile, in the example shown in FIG. 12, for the blue light, the intensity of the light produced by the interference of the direct light DLb and the reflection light RLb is zero when the emission angle is 0° (in other words, when viewed normal N to the reflective surface 11$ra$) and also zero when the emission angle is in the vicinity of 60° or 90°. Then, for example, for the blue light, when the emission angle is in the vicinity of 40°, the intensity of the light produced by the interference of the direct light DLb and the reflection light RLb has the highest peak of approximately 0.75, and the intensity of light is high in comparison with when viewed from the normal N due to the interference of the direct light DLb and the reflection light RLb. Furthermore, in the example shown in FIG. 12, similarly, when the emission angle is in the vicinity of 73°, the intensity of the light produced by the interference of the direct light DLb and the reflection light RLb has the second highest peak of approximately 0.28, and the intensity of light is high in comparison with when viewed from the normal N due to the interference of the direct light DL and the reflection light RL.

In addition, in the example shown in FIG. 12, for the red light, when the emission angle is 0° (in other words, when viewed normal N to the reflective surface 11$ra$), the intensity of the light produced by the interference of the direct light DLr and the reflection light RLr has the highest peak of 1, and the intensity of light is high due to the interference of the direct light DL and the reflection light RL. Furthermore, when the emission angle is in the vicinity of 67°, the intensity has the second highest peak of approximately 0.37, and the intensity of light is high due to the interference of the direct light DLr and the reflection light RLr. Then, for example, for the red light, the intensity of the light produced by the interference of the direct light DLr and the reflection light RLr is a minimum at 0 When the emission angle is in the vicinity of 47° or in the vicinity of 90°.

As described here, in the light-emitting element 3$rb$ in accordance with an embodiment, the blue light (second light) has at least one high light-intensity location due to the interference of the direct light DL and the reflection light RL in the direction inclined by the angle of inclination θ to the normal N to the reflective surface 11$ra$ in comparison with the normal N.

Hence, the light-emitting element 3$rb$ has a higher blue light intensity in the high blue light-intensity location than in the normal N. Therefore, for example, the image displayed in the display area 5 of the display device 1 using the light-emitting element 3$rb$ is difficult to visually recognize in a high blue light-intensity location even if the image is visually recognizable from the normal N to the display area 5. Hence, the resultant display device 1, using the light-emitting element 3$rb$ and the light-emitting element 3$rb$, can restrict peeping from oblique directions, Specifically, in the example shown in FIG. 12, the blue light has an intensity of 0 when the emission angle is 0°, 60°, and 90° in the range of from 0° to 90° and has an intensity in excess of 0 when the emission angle is not 0°, 60°, and 90°. In other words, in the example shown in FIG. 12, for the blue light, the high light-intensity locations due to the interference of the direct light DL and the reflection light RL in comparison with the normal N are emission angles other than 0°, 60°, and 90° in the range of emission angles of from 0° to 90°.

In addition, let the intensity of the light produced by the interference of the reflection light RL and the direct light DL in the blue light be $\sin^2(\pi D/\lambda_2)$, and the intensity of the light produced by the interference of the reflection light RL and the direct light DL in the blue light as viewed from the direction inclined to the normal N by an angle of inclination $\theta$ be $\sin^2(\pi D\cos\theta/\lambda_2)$. Note that $\lambda_2=\lambda_{blue}$.

Under these conditions, the light-emitting element 3*rb* in accordance with an embodiment has $\times_2$, D, and $\theta$ that satisfy mathematical expression 10 below for the direction inclined to the normal N to the reflective surface 11*ra* by an angle of inclination $\theta$.

$$\sin^2(\pi D \cos\theta/\lambda_2) > \sin^2(\pi D/\lambda_2) \quad \text{(Mathematical Expression 10)}$$

Hence, the light-emitting element 3*rb* has a higher blue light intensity for the angle of inclination $\theta$ that satisfies mathematical expression 10 above, than in the normal N. Therefore, for example, the image displayed in the display area 5 of the display device 1 using the light-emitting element 3*rb* is difficult to visually recognize in a high blue light-intensity location even if the image is visually recognizable from the normal N to the display area 5. Hence, the resultant display device 1, using the light-emitting element 3*rb* and the light-emitting element 3*rb*, can restrict peeping from oblique directions.

Specifically, in the example shown in FIG. 12, the blue light has an intensity of 0 when the emission angle is 0°. In other words, $\sin^2(\pi D/\lambda_2)=0$. Then, the blue light has an intensity in excess of 0 when the emission angle is not 60° and 90° in the range of emission angles of from 0° to 90°, In other words, in the example shown in FIG. 12, mathematical expression 10 above holds when the emission angle is not 60° and 90°.

As described here, in the embodiment, the blue light emitted by the light-emitting element 3*rb* has a minimum light intensity in the normal N to the reflective surface 11*ra*.

In the example shown in FIG. 12, $\sin^2(\pi D/\lambda_2)$, which represents the intensity of the blue light, is equal to 0 for the normal N to the reflective surface 11*ra*.

Hence, the light-emitting element 3*rb* has a higher red light intensity than a blue light intensity in the normal N. Therefore, it is possible to reduce difficulty in visually recognizing the image from the normal N to the display area 5. In other words, the display device 1 allows the user to comfortably recognize the image from the normal N to the display area 5 and additionally restricts, for example, peeping by other persons from the direction inclined to the normal N to the display area 5 by an angle of inclination $\theta$.

In addition, between the red and blue light emitted by the light-emitting element 3*rb* in accordance with the embodiment, the red light has a higher light intensity in the normal N to the reflective surface 11*ra*. For instance, let the intensity of the light produced by the interference of the reflection light RLr and the direct light DLr in the red light be $\sin^2(\pi D/\lambda_1)$, and the intensity of the light produced by the interference of the reflection light RLb and the direct light DLb in the blue light be $\sin^2(\pi D/\lambda_2)$. Note that $\lambda_1=\lambda_{red}$, and $\lambda_2=\lambda_{blue}$.

Under these conditions, mathematical expression 11 below is satisfied in the normal N to the reflective surface 11*ra*.

$$\sin^2(\pi D/\lambda_1) > \sin(\pi D/\lambda_2) \quad \text{(Mathematical Expression 11)}$$

Hence, the light-emitting element 3*rb* has a higher red light intensity than a blue light intensity in the normal N. Therefore, it is possible to reduce difficulty in visually recognizing the image from the normal N to the display area 5. In other words, the display device 1 allows the user to comfortably recognize the image from the normal N to the display area 5 and additionally restricts, for example, peeping by other persons from the direction inclined to the normal N to the display area 5 by an angle of inclination $\theta$.

In the embodiment, the red light emitted by the light-emitting element 3*rb* has a maximum light intensity in the normal N to the reflective surface 11*ra*. In the example shown in FIG. 12, $\sin^2(\pi D/\lambda_1)=1$ in the normal N to the reflective surface 11*ra*.

Therefore, it is possible to reduce difficulty in visually recognizing the image from the normal N to the display area 5.

In addition, the light-emitting element 3*rb* has an angle of inclination $\theta$ that satisfies mathematical expression 12 below.

$$\sin^2((\pi D\cos\theta)/\lambda_2) > \sin^2((\pi D\cos\theta)/\lambda_1) \quad \text{(Mathematical Expression 12)}$$

Hence, it is possible to reduce visual recognizability of the image from the direction of the angle of inclination $\theta$ and restrict peeping from oblique directions. In the example shown in FIG. 12, when the emission angle is from the vicinity of 32° to the vicinity of 55°, both inclusive, and from the vicinity of 75° to the vicinity of 90°, both inclusive, the blue light has a higher intensity than the red light.

FIG. 14 is a diagram representing the intensity of the red and blue light in the normal N for various optical path length differences D in the light-emitting element 3*rb* in accordance with an embodiment.

As described earlier, in the light-emitting element 3*rb*, the red light preferably has a higher intensity than the blue light in the normal N to the reflective surface 11*ra*, because in such a case, the image displayed in the display area 5 of the display device 1 using the light-emitting element 3*rb* is easily recognizable from the normal N to the display area 5.

In other words, as described earlier, the light-emitting element 3*rb* preferably satisfies mathematical expression 11 below for the normal N to the reflective surface 11*ra*.

$$\sin^2(\pi D/\lambda_1) > \sin^2(\pi D/\lambda_2) \quad \text{(Mathematical Expression 11)}$$

In the example shown in FIG. 14, for example, $\lambda_1=\lambda_{red}=620$ nm, and $\lambda_2=\lambda_{blue}=465$ nm.

For instance, as shown in FIG. 14, in the light-emitting element 3*rb*, the optical path length difference D between the direct light DLr and the reflection light RLr in red light in the normal N to the reflective surface 11*ra* is preferably from 266 nm to 531 nm, both inclusive, as denoted by arrow A1, from 797 nm to 1,063 nm, both inclusive, as denoted by arrow A2, and from 1,329 nm to 1,594 nm, both inclusive, as denoted by arrow A3.

Hence; the red light can be rendered to have a higher intensity than the blue light in the normal N to the reflective surface 11*ra*.

In addition, more preferably, $\sin^2(\pi D/\lambda_2)=0$ $(\lambda_2=\lambda_{blue})$. This enables, for example, the user to more easily recognize the image from the normal N to the reflective surface 11*ra*. In the example shown in FIG. 14, for example, it is when the optical path length difference D between the direct light DLb and the reflection light RLb in blue light is in the vicinity of 470 nm, in the vicinity of 930 nm, in the vicinity of 1,400 nm, and in the vicinity of 1,870 nm.

Figure 16:
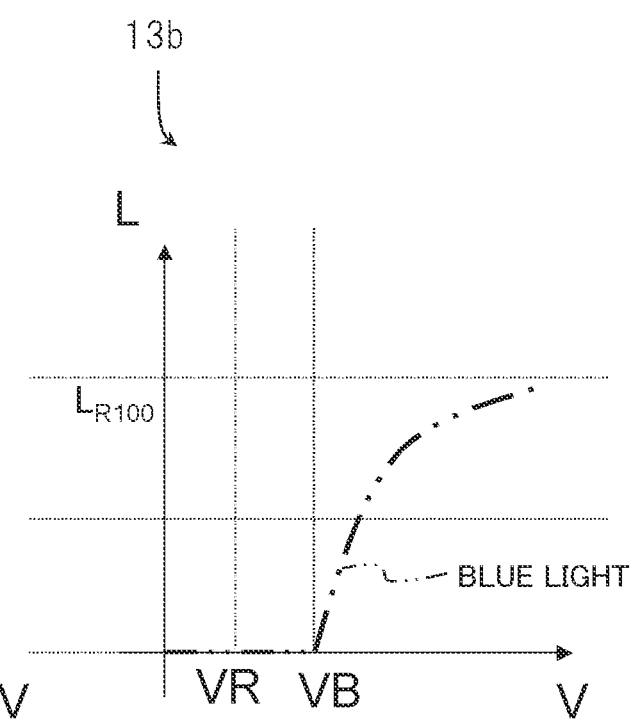
FIG. 16 is a schematic diagram representing a relationship between the voltage applied across a light-emitting layer in accordance with an embodiment and the luminance of blue-light-emitting quantum dots in the light-emitting layer.
Figure 17:
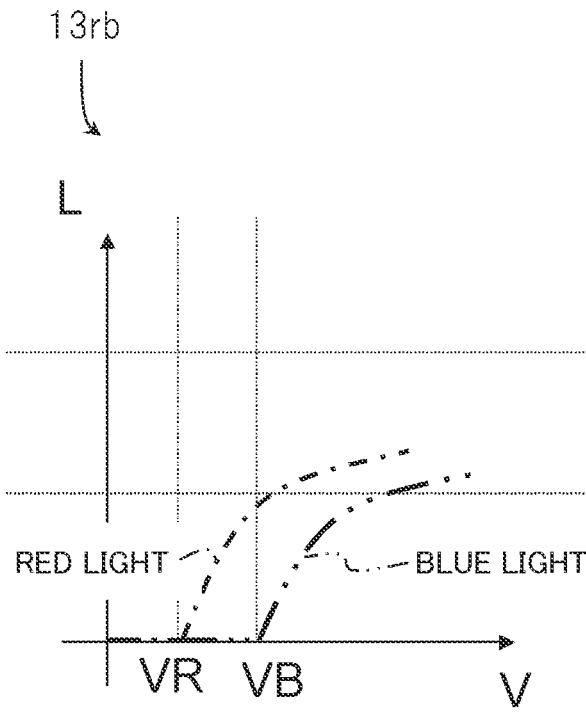
FIG. 17 is a schematic diagram representing relationships between the voltage applied across a light-emitting layer in accordance with an embodiment and the luminance of blue-light-emitting quantum dots and red-light-emitting quantum dots in the light-emitting layer.

A description is given next of mix ratios of the quantum dots 16*r* and the quantum dots 16*b* in the light-emitting layer 13*rb* of the light-emitting element 3*rb* with reference to FIGS. 15 to 17. FIG. 15 is a schematic diagram representing a relationship between the voltage V applied across a light-emitting layer 13*r* exclusively of the red-light-emitting quantum dots 16*r* and the luminance L of the quantum dots 16*r* in the light-emitting layer 13*r*.

FIG. 16 is a schematic diagram representing a relationship between the voltage V applied across the light-emitting layer 13b in accordance with an embodiment and the luminance L of the blue-light-emitting quantum dots in the light-emitting layer 13b. FIG. 17 is a schematic a diagram representing relationships between the voltage V applied across the light-emitting layer 13rb in accordance with an embodiment and the luminance L of the blue-light-emitting quantum dots 16b and the red-light-emitting quantum dots 16r in the light-emitting layer 13rb.

The mix ratio of the quantum dots 16r and the quantum dots 16b in the light-emitting layer 13rb preferably satisfies two conditions: (1) the red-light-emitting quantum dots 16r emit sufficient light under the emission starting voltage VB for the blue-light-emitting quantum dots 16b, and (2) the blue-light-emitting quantum dots 16b emit sufficient light when the display device 1 displays an image in the second display mode.

Therefore, for example, as shown in FIG. 15, a light-emitting element is prepared that contains the light-emitting layer 13r exclusively of the red-light-emitting quantum dots 16r. In addition, as shown in FIG. 16, the light-emitting element 3b containing the light-emitting layer 13b is prepared. Then, the characteristics of the voltage V and the luminance L are measured in the light-emitting element that emits solely emitted red light and in the light-emitting element 3b that emits solely blue light.

Here, the luminous efficiency of the quantum dots 16r emitting red light is higher than the luminous efficiency of the quantum dots 16b emitting blue light. In addition, visual recognizability is higher for the red light than for the blue light. Therefore, as shown in FIGS. 15 and 16, when the same voltage V is applied, the red light has a higher luminance L than the blue light.

In addition, let the voltage under which a minimum luminance (e.g., 1 cd/m$^2$) that can be measured by a luminance measuring instrument is obtained be equal to the emission starting voltages VR, VB of the light-emitting element.

Then, let the highest luminance (e.g., specification value) required in the first display mode be $L_{use}$ (=$L_{max}$), and the luminance of the light-emitting element including the light-emitting layer 13r under the voltage VB be $L_{R100}$. In addition, in the light-emitting element 3rb including the light-emitting layer 13rb, let the proportion of the red-light-emitting quantum dots 16r be $L_{use}/L_{R100}$ (be a minimum amount at which the red-light-emitting quantum dots 16r emit light with $L_{use}$ under the voltage VB).

In other words, in the light-emitting layer 13rb, the proportion of the blue-light-emitting quantum dots 16b needs only to be set to 1-$L_{use}/L_{R100}$.

For instance, all the light-emitting elements 3rb, 3g, 3b have a forward structure. In addition, as an example, the light-emitting element 3rb has the following structure. The second electrode 15, which is an anode and a transparent electrode, has a thickness of 30 nm and contains ITO, The hole transport layer 14r includes a stack of a first layer containing PEDOT:PSS and a second layer containing PVK. The first layer containing PEDOT:PSS has a thickness of 40 nm, and the second layer containing PVK is 20 nm. The quantum dots 16r, 16b in the light-emitting layer 13rb contain CdSe. The light-emitting layer 13rb has a thickness of 10 nm. The electron transport layer 12r has a thickness of 50 nm and contains ZnO. The first electrode 11r, which is a cathode and a reflective electrode, has a thickness of 100 nm and contains Al.

In addition, the quantum dots 16r and the quantum dots 16b in the light-emitting layer 13rb has a ratio of 1:1.

For instance, the emission starting voltage VR is 3 V, and the emission starting voltage VB is 4 V.

The light-emitting element 3rb including the light-emitting layer 13rb containing the red-light-emitting quantum dots 16r and the blue-light-emitting quantum dots 16r is obtained in this manner.

Note that the thickness of the light-emitting layer 13rb and the thickness of the electron transport layer 12r in the light-emitting element 3rb can be measured, for example, in the cross-section of the light-emitting element 3rb by, for example, scanning electron microscopy (SEM) or transmission electron microscopy (TEM or STEM). Note that since the thickness differs at the center of the pixel PX and at the periphery of the pixel PX in a plan view (in other words, at the center of the light-emitting element 3rb and at the periphery of the light-emitting element 3rb in a plan view), the thickness needs only to be measured, for example, at the center of the pixel PX (in other words, at the center of the light-emitting element 3rb in a plan view).

In addition, the refractive index of the light-emitting layer 13rb and the refractive index of the electron transport layer 12r can be determined, for example, by measuring the compositions of the light-emitting layer 13rb and the electron transport layer 12r by, for example, cross-section SEM-EDM.

In addition, for example, those quantum dots that have the same composition and substantially the same particle diameter (e.g., the difference is ±2 nm or smaller) are regarded as having the same peak (peak wavelength) in the emission wavelength. In this case, whether or not the light-emitting layer 13rb contains a plurality of types of quantum dots with different peak wavelengths can be determined by measuring the particle diameter of the quantum dots by, for example, cross-section SEM-EDM and then measuring the peak wavelength in the emission wavelength of those quantum dots that have the same measured composition and substantially the same measured particle diameter.

Figure 18:
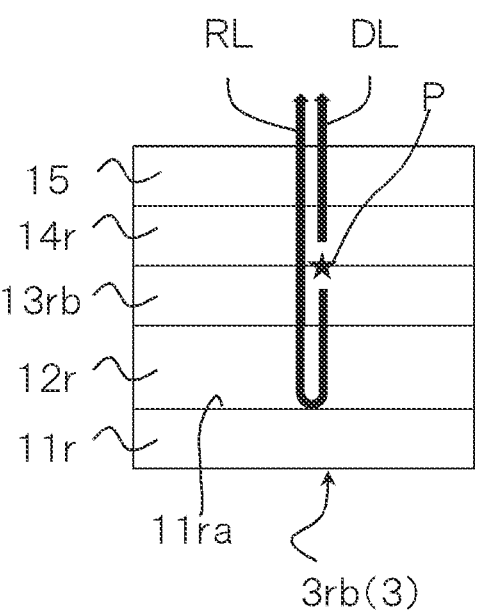
FIG. 18 is a schematic diagram showing the location of a light-emitting point in a light-emitting element of a forward structure.

FIG. 18 is a schematic diagram showing the location of the light-emitting point P in the light-emitting element 3rb of a forward structure. For instance, the interface of the light-emitting layer 13rb with the hole transport layer 14r is more clearly and easily recognizable than the interface of the light-emitting layer 13rb with the electron transport layer 12r when the cross-section of the light-emitting element 3rb is observed by, for example, scanning electron microscopy (SEM) or transmission electron microscopy (TEM or STEM).

Therefore, the location of the light-emitting point P in the light-emitting layer 13rb in the thickness direction of the light-emitting layer 13rb is preferably on the interface of the light-emitting layer 13rb with the hole transport layer 14r as shown in FIG. 18. Hence, the location of the light-emitting point P in the light-emitting layer 13rb in the thickness direction of the light-emitting layer 13rb can be more clearly determined.

As described here, when the light-emitting point P is on the interface of the light-emitting layer 13rb with the hole transport layer 14r in the light-emitting element 3rb of a forward structure, the optical path length difference D between the direct light DL and the reflection light RL is given by the following mathematical expression. Note that "2×" at the front of the following mathematical expression is to obtain a total optical path length to and from the reflective surface 11ra.

$$D=2\times(\text{Thickness of Light-emitting Layer } \mathbf{13}rb\times\text{Refractive Index of Light-emitting Layer } \mathbf{13}rb+\text{Thickness of Electron Transport Layer } \mathbf{12}r\times\text{Refractive Index of Electron Transport Layer } \mathbf{12}r)$$

Figure 19:
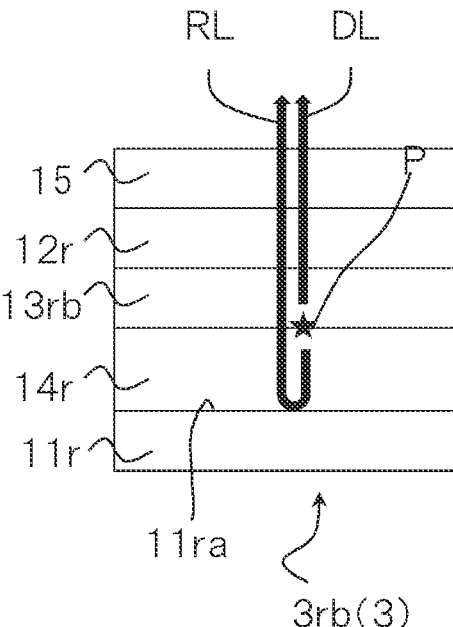
FIG. 19 is a schematic diagram showing the location of a light-emitting point in a light-emitting element of a reverse structure.

FIG. 19 is a schematic diagram showing the location of the light-emitting point P in the light-emitting element 3rb of a reverse structure. As described earlier, the light-emitting element 3rb may have a reverse structure. In the case of a reverse structure, the first electrode 11r is an anode and a reflective electrode, and the second electrode 15 is a cathode and a transparent electrode. In addition, in the case of a reverse structure, the interface of the first electrode 11r, which is an anode, with the hole transport layer 14r is the reflective surface 11ra by which the reflection light RL is reflected.

In the case of a reverse structure, the location of the light-emitting point P in the light-emitting layer 13rb in the thickness direction of the light-emitting layer 13rb is similarly preferably on the interface of the light-emitting layer 13rb with the hole transport layer 14r. Hence, the location of the light-emitting point P in the light-emitting layer 13rb in the thickness direction of the light-emitting layer 13rb can be more clearly determined.

As described here, when the light-emitting point P is on the interface of the light-emitting layer 13rb with the hole transport layer 14r in the light-emitting element 3rb of a reverse structure, the optical path length difference D between the direct light DL and the reflection light RL is given by the following mathematical expression.

$$D=2\times\text{Thickness of Hole Transport Layer } \mathbf{14}r\times\text{Refractive Index of Hole Transport Layer } \mathbf{14}r$$

Figures 20, 21, 22:
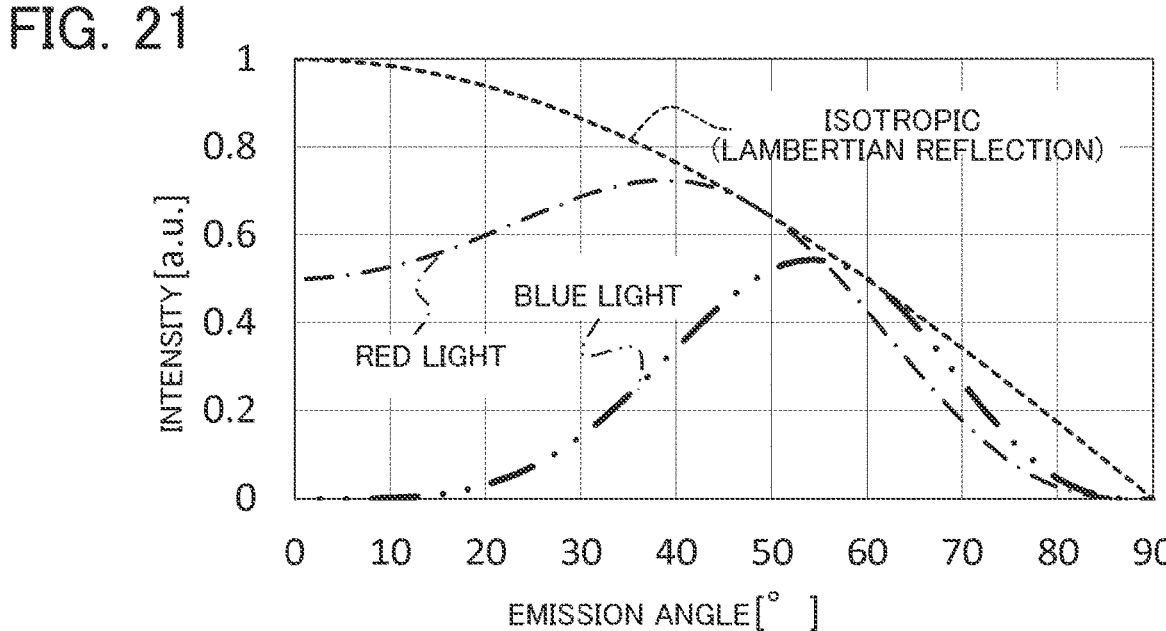
FIG. 20 is a diagram showing a specific example of a light-emitting layer in a light-emitting element in accordance with an embodiment.
FIG. 21 is a diagram representing the intensity of red and blue light for various emission angles in a light-emitting element in accordance with Variation Example 1 of an embodiment.
FIG. 22 is a diagram showing a specific example of a light-emitting layer in a light-emitting element in accordance with Variation Example 1 of an embodiment.

FIG. 20 is a diagram showing a specific example of the light-emitting layer 13rb in the light-emitting element 3rb in accordance with an embodiment. A specific example where the intensity of blue light for various emission angles shown in FIG. 12 is obtained is the example shown in FIG. 20. "Blue QDs" in FIG. 20 represent the quantum dots 16b.

In addition, the thickness [nm] represents the sum of the thickness of the electron transport layer 12r and the thickness of the light-emitting layer 13rb when the light-emitting element 3rb has a forward structure and represents the thickness of the hole transport layer when the light-emitting element 3rb has a reverse structure. In addition, the electron transport layer 12r and the light-emitting layer 13rb have a refractive index of 2.

In addition, $1.5<D/\lambda_2<2.5 (\lambda_2=\lambda_{blue})$.

For instance, the quantum dots 16b in the light-emitting layer 13rb, when containing ZnSe, emit blue light with a wavelength $\lambda_{blue}$ of 430 nm. In addition, the optical path length difference D between the direct light DLb and the reflection light RLb in the blue light has a range of 645 nm≤D≤1,075 nm. The thickness is from 161 nm to 269 nm, both inclusive.

Alternatively, for example, the quantum dots 16b in the light-emitting layer 13rb, when containing ZnSe and having a large particle diameter, emit blue light with a wavelength $\lambda_{blue}$ of 450 nm. In addition, the optical path length difference D between the direct light DLb and the reflection light RLb in the blue light has a range of 675 nm≤D≤1,125 nm. The thickness is from 169 nm and 281 nm, both inclusive.

Alternatively, for example, to satisfy BT2020 the quantum dots 16b in the light-emitting layer 13rb, when containing CdSe, emit blue light with a wavelength $\lambda_{blue}$ of 467 nm. In addition, the optical path length difference D between the direct light DLb and the reflection light RLb in the blue light has a range of 701 nm≤D≤1,168 nm. The thickness is from 175 nm to 292 nm, both inclusive.

A specific structure of the light-emitting element 3rb is, for example, a forward structure in which the quantum dots 16b in the light-emitting layer 13rb contains CdSe and emit blue light with s wavelength $\lambda_{blue}$ of 467 nm. D/λ=2, D=934 nm, and Thickness (Thickness of Light-Emitting Layer 13rb+Thickness of Electron Transport Layer 12r)=234 nm. In addition, the second electrode 15, which is an anode and a transparent electrode, has a thickness of 30 nm and contains ITO. The hole transport layer 14r includes a stack of a first layer containing PEDOT:PSS and a second layer containing PVK. The first layer containing PEDOT:PSS has a thickness of 40 nm, and the second layer containing PVK is 20 nm. The quantum dots 16r, 16b in the light-emitting layer 13rb contain CdSe. The light-emitting layer 13rb has a thickness of 30 nm. The electron transport layer 12r has a thickness of 204 nm and contains ZnO. The first electrode 11r, which is a cathode and a reflective electrode, has a thickness of 100 nm and contains A1.

The light-emitting element 3rb in accordance with an embodiment can be hence formed.

From FIG. 20, D and $\lambda_2=\lambda_{blue}$ in the light-emitting element 3rb can be described as having the following ranges.

$$1.5<(D/\lambda_2)<2.5$$

$$430 \text{ nm}\leq\lambda_2\leq467 \text{ nm}$$

$$645 \text{ nm}\leq D\leq1,168 \text{ nm}$$

FIG. 21 is a diagram representing the intensity of red and blue light for various emission angles in the light-emitting element 3rb in accordance with Variation Example 1 of the embodiment. FIG. 21 represents a different example from the intensity of red and blue light for various emission angles in the light-emitting element 3rb, as shown in FIG. 12. In the example shown in FIG. 21, in mathematical expression 5 described above, $\pi D/\lambda_{red}=0.75\pi$ for the red light, and $D\pi/\lambda_{blue}=\pi$ for the blue light. Note that the interference of the direct light DLr and the reflection light in red light are not adjusted.

In FIG. 21, the alignment property of red light represented by mathematical expression 6 above is shown by a dash-dot line, and the alignment property of blue light represented by mathematical expression 7 above is shown by a dash-double-dot line. In FIG. 21, the horizontal axis represents an angle of inclination θ as an emission angle [°] of from 0° to 90°, and the vertical axis represents the intensity of the light produced by the constructive interference of the direct and reflection light in red and blue light. Note that in FIG. 21, for comparison, a dotted line indicates the intensity of light that follows Lambertian reflection for various emission angles [°].

In the example shown in FIG. 21, for blue light, the intensity of the light produced by the interference of the direct light DLb and the reflection light RLb is 0 when the emission angle is 0° (that is, when viewed from the normal N to the reflective surface 11ra). The intensity is also 0 when the emission angle is 90°. Then, for example, for blue light, the intensity of the light produced by the interference of the direct light DLb and the reflection light RLb has the highest peak of approximately 0.57 when the emission angle is in the vicinity of 55°.

In addition, in the example shown in FIG. 21, for the red light, the intensity of the light produced by the interference of the direct light DLr and the reflection light RLr is approximately 0.5, which is higher than for blue light, when the emission angle is 0° (that is, when viewed from the normal N to the reflective surface 11*ra*). Then, when the emission angle is in the vicinity of 40°, the intensity has the highest peak of approximately 0.73, and the intensity of light is high due to the interference of the direct light DLr and the reflection light RLr. Then, for example, for the red light, the intensity of the light produced by the interference of the direct light DLr and the reflection light RLr is a minimum of 0 when the emission angle is 90°.

As described here, in the light-emitting element 3*rb* in accordance with Variation Example 1 shown in FIG. 21, the blue light (second light) similarly has at least one high light-intensity location due to the interference of the direct light DL and the reflection light RL in the direction inclined by the angle of inclination θ to the normal N to the reflective surface 11*ra* in comparison with the normal N.

Specifically, in the example shown in FIG. 21, for the blue light, the high light-intensity locations due to the interference of the direct light DL and the reflection light RI, in comparison with the normal N are emission angles other than 0' and 90° in the range of emission angles of from 0° to 90°.

In addition, in the example shown in FIG. 21, the light-emitting element 3*rb* similarly has $\lambda_2$, D, and θ that satisfy mathematical expression 10 above for the direction inclined to the normal N to the reflective surface 11*ra* by an angle of inclination θ. Note that $\lambda_2 = \lambda_{blue}$.

$$\sin^2(\pi D \cos \theta / \lambda_2) > \sin^2(\pi D / \lambda_2) \qquad \text{(Mathematical Expression 10)}$$

Specifically, in the example shown in FIG. 21, blue light has an intensity of 0 (that is, $\sin^2(\pi D/\lambda_2)=0$) when the emission angle is 0° and has an intensity in excess of 0 when the emission angle is in the range of from 0° to 90° exclusive. In other words, in the example shown in FIG. 21, mathematical expression 10 holds when the emission angle is not 90°.

The red light has a wider emission angle (approximately 60°) in the example shown in FIG. 21 than in the example shown in FIG. 12. In other words, the emission angle at which visual recognizability is not decreased is wide. Therefore, the user can visually recognize the image displayed in the display area 5 with a wider viewing angle.

In addition, in the example shown in FIG. 21, the blue light does not show zero intensity at any emission angle in the range of from 0° to 90° except when the emission angle is 0° and 90°. Therefore, peeping from oblique directions can be restricted for a wider range of emission angles.

FIG. 22 is a diagram showing a specific example of the light-emitting layer 13*rb* in the light-emitting element 3*rb* in accordance with Variation Example 1 of the embodiment. A specific example where the intensity of blue light for various emission angles shown in FIG. 21 is Obtained is the example shown in FIG. 22. "Blue QDs" in FIG. 22 represent the quantum dots 16*b*.

In addition, the thickness [nm] represents the sum of the thickness of the electron transport layer 12*r* and the thickness of the light-emitting layer 13*rb* when the light-emitting element 3*rb* has a forward structure and represents the thickness of the hole transport layer when the light-emitting element 3*rb* has a reverse structure. In addition, the electron transport layer 12*r* and the light-emitting layer 13*rb* have a refractive index of 2.

In addition, $0.5 < D/\lambda_2 < 1.5 (\lambda_2 = \lambda_{blue})$.

For instance, the quantum dots 16*b* in the light-emitting layer 13*rb*, when containing ZnSe, emit blue light with a wavelength $\lambda_{blue}$ of 430 nm. In addition, the optical path length difference D between the direct light DLb and the reflection light RLb in the blue light has a range of 215 nm≤D≤645 nm. The thickness is from 54 nm to 161 nm, both inclusive.

Alternatively, for example, the quantum dots 16*b* in the light-emitting layer 13*rb*, when containing ZnSe and having a large particle diameter, emit blue light with a wavelength $\lambda_{blue}$ of 450 nm. In addition, the optical path length difference D between the direct light DLb and the reflection light RLb in the blue light has a range of 225 nm≤D≤675 nm. The thickness is from 56 nm to 169 nm, both inclusive.

Alternatively, for example, to satisfy BT2020 the quantum dots 16*b* in the light-emitting layer 13*rb*, when containing CdSe, emit blue light with a wavelength $\lambda_{blue}$ of 467 nm. In addition, the optical path length difference D between the direct light DLb and the reflection light RLb in the blue light has a range of 234 nm≤D≤701 nm. The thickness is from 58 nm to 175 nm, both inclusive.

A specific structure of the light-emitting element 3*rb* is, for example, a forward structure in which the quantum dots 16*b* in the light-emitting layer 13*rb* contain CdSe and emit blue light with a wavelength $\lambda_{blue}$ of 467 nm. D/λ=1, D=467 nm, and Thickness (Thickness of Light-emitting Layer 13*rb*+Thickness of Electron Transport Layer 12*r*)=117 nm. In addition, the second electrode 15, which is an anode and a transparent electrode, has a thickness of 30 nm and contains ITO. The hole transport layer 14*r* includes a stack of a first layer containing PEDOT:PSS and a second layer containing PVK. The first layer containing PEDOT:PSS has a thickness of 40 nm, and the second layer containing PVK is 20 nm. The quantum dots 16*r*, 16*b* in the light-emitting layer 13*rb* contain CdSe. The light-emitting layer 13*rb* has a thickness of 30 nm. The electron transport layer 12*r* has a thickness of 87 nm and contains ZnO. The first electrode 11*r*, which is a cathode and a reflective electrode, has a thickness of 100 nm and contains A1.

The light-emitting element 3*rb* in accordance with an embodiment can be hence formed.

From FIG. 22, D and $\lambda_2 = \lambda_{blue}$ in the light-emitting element 3*rb* can be described as having the following ranges.

$$0.5 < (D/\lambda_2) < 1.5$$

$$430 \text{ nm} \le \lambda_2 \le 462 \text{ nm}$$

$$215 \text{ nm} \le D \le 701 \text{ nm}$$

Figure 23:
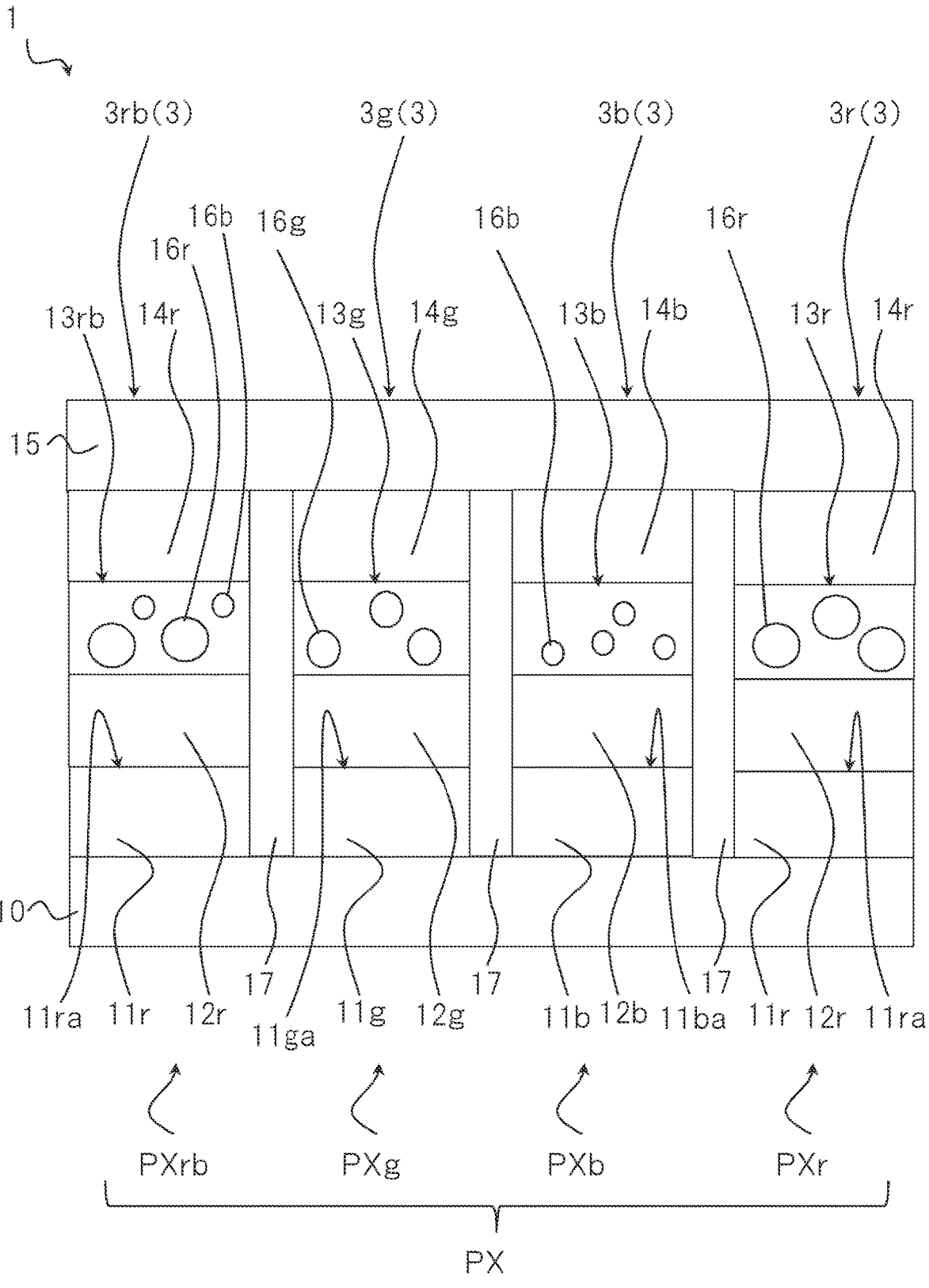
FIG. 23 is a schematic cross-sectional view of a red pixel, a green pixel, a blue pixel, and another red pixel in a display device in accordance with Variation Example 2 of an embodiment.

FIG. 23 is a schematic cross-sectional view of a red pixel PXrb, a green pixel PXg, a blue pixel PXb, and a red pixel PXr in the display device 1, in accordance with Variation Example 2 of the embodiment. The pixel PX in the display device 1 may include, as subpixels, the red pixel PXr as well as the red pixel PXrb, the green pixel PXg, and the blue pixel PXb. The red pixel PXr includes a light-emitting element (fourth light-emitting element) 3*r*.

The light-emitting element 3*r* includes a light-emitting layer (fourth light-emitting layer) 13*r* in place of the light-emitting layer 13*rb* in the light-emitting element 3*rb*. The light-emitting element 3*r* has otherwise the same structure as the light-emitting element 3*rb*. The light-emitting layer 13*r* differs from the light-emitting layer 13*rb* in that the light-emitting layer 13*r* contains only the quantum dots 16*r* and does not contain the quantum dots 16*b*. Therefore, the light-emitting layer 13*r* emits only red light and does not emit blue light.

The display device 1 may include the light-emitting element 3*r* including the red-light-emitting layer 13*r* as described here.

In addition, a plurality of pixels PX including a red pixel PXrb, a green pixel PXg, and a blue pixel PXb and a plurality of pixels PX including a red pixel PXr, a green pixel PXg, and a blue pixel PXb may be provided in, for example, a staggered manner in the display area 5 of the display device 1. This structure can similarly reduce the visual recognizability of an image from Oblique directions, which restricts peeping from oblique directions.

Any of the elements described in the embodiments and variation examples may be used in a proper combination so long as the combination works out well.

The invention claimed is:

1. A light-emitting element comprising:
   a first electrode having a reflective surface that reflects light;
   a second electrode that transmits light; and
   a light-emitting layer between the first electrode and the second electrode, the light-emitting layer containing a first light-emitting material that emits a first light that has a peak wavelength equal to a first wavelength, and a second light-emitting material that emits a second light that has a peak wavelength equal to a second wavelength, shorter than the first wavelength, wherein:
   in at least one location of the light-emitting layer, an off-normal intensity of the second light, which is emitted in a direction off a normal to the reflective surface, is higher than a normal intensity of the second light, which is emitted in a direction of the normal, and
   the normal intensity is a minimum intensity.

2. The light-emitting element according to claim 1, wherein one or both of the first light-emitting material and the second light-emitting material includes quantum dots.

3. The light-emitting element according to claim 1, wherein the light-emitting layer is a single layer.

4. The light-emitting element according to claim 1, wherein in the normal to the reflective surface, the first light has a first intensity higher than the normal intensity of the second light.

5. The light-emitting element according to claim 1, wherein the off-normal intensity is produced by interference of reflection light reflected by the reflective surface and transmitted by the second electrode, and direct light not reflected by the reflective surface and transmitted by the second electrode.

6. The light-emitting element according to claim 1, further comprising:
   an electron transport layer; and
   a hole transport layer, wherein:
   either one of the electron transport layer and the hole transport layer is provided between the first electrode and the light-emitting layer, and
   another one of the electron transport layer and the hole transport layer is provided between the second electrode and the light-emitting layer.

7. The light-emitting element according to claim 1, wherein:
   the first light-emitting material and the second light-emitting material are-include quantum dots, and
   the first light-emitting material starts emitting the first light under an emission starting voltage, and the second light-emitting material starts emitting the second light under an emission starting voltage, the emission starting voltage being higher than the emission starting voltage.

8. A display device comprising:
   a first light-emitting element that is the light-emitting element according to claim 1;
   a second light-emitting element including a second light-emitting layer that emits the second light; and
   a third light-emitting element including a third light-emitting layer that emits a third light that has a peak wavelength shorter than the first wavelength and longer than the second wavelength.

9. The display device according to claim 8, further comprising a fourth light-emitting element including a fourth light-emitting layer that emits the first light.

10. The light-emitting element according to claim 1, wherein the minimum intensity is zero.

* * * * *